US012757478B2

(12) United States Patent

Lee et al.

(10) Patent No.: US 12,757,478 B2
(45) Date of Patent: Oct. 6, 2026

(54) SELF-CLAMPING RESISTOR AND CIRCUIT FOR TRANSISTOR LINEAR REGION CURRENT MATCHING

(71) Applicant: Texas Instruments Incorporated, Dallas, TX (US)

(72) Inventors: Zachary Lee, Fremont, CA (US); Wenyuan Sun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 562 days.

(21) Appl. No.: 18/345,470

(22) Filed: Jun. 30, 2023

(65) Prior Publication Data

US 2025/0006728 A1 Jan. 2, 2025

(51) Int. Cl.

| | |
|---|---|
| ***H10D 84/00*** | (2025.01) |
| ***H10D 84/01*** | (2025.01) |
| ***H10D 84/03*** | (2025.01) |
| ***H10D 84/60*** | (2025.01) |
| ***H10D 84/80*** | (2025.01) |

(52) U.S. Cl.

CPC ....... *H10D 84/204* (2025.01); *H10D 84/0112* (2025.01); *H10D 84/038* (2025.01); *H10D 84/611* (2025.01); *H10D 84/811* (2025.01)

(58) Field of Classification Search

CPC ..... H10D 84/01; H10D 84/0112–0121; H10D 84/02; H10D 84/032; H10D 84/035; H10D 84/038; H10D 84/05; H10D 84/07; H10D 84/08; H10D 84/204; H10D 84/221; H10D 84/403; H10D 84/409; H10D 84/611; H10D 84/619; H10D 84/811; H10D 84/813; H10D 84/817

See application file for complete search history.

(56) References Cited

U.S. PATENT DOCUMENTS

| | | | | |
|---|---|---|---|---|
| 9,905,688 B2 | 2/2018 | Lee | | |
| 2001/0033004 A1* | 10/2001 | Lin | ..................... | H10D 89/601 257/360 |

* cited by examiner

*Primary Examiner* — Cheung Lee

(74) *Attorney, Agent, or Firm* — Yudong Kim; Frank D. Cimino

(57) ABSTRACT

An electronic device includes a resistor with a drift region having majority carrier dopants of a first conductivity type and resistor terminals including first and second implanted wells with majority carrier dopants of the first conductivity type along laterally opposite sides of the drift region in a semiconductor layer, and a diode integrated with the resistor and including majority carrier dopants of a second conductivity type in the semiconductor layer adjacent one of the first and second implanted wells to limit a voltage across the resistor.

24 Claims, 18 Drawing Sheets

SELF-CLAMPING RESISTOR AND CIRCUIT FOR TRANSISTOR LINEAR REGION CURRENT MATCHING

BACKGROUND

Amplifier circuits and other circuits having high and low-side transistors in a half-bridge configuration can use a resistor to help match the linear region currents of the high and low-side transistors to reduce distortion and to achieve symmetrical waveforms. However, the high and low-side transistors behave like current sources when in the saturation region, resulting in large power dissipation in the matching resistor without the resistor contributing to any current matching between the high and low-side transistors.

SUMMARY

In one aspect, an electronic device includes a semiconductor layer, a resistor in the semiconductor layer, and a diode in the semiconductor layer where at least a portion of the resistor includes or forms a p-n junction of the diode.

In another aspect, a circuit includes a p-channel MOSFET, an n-channel MOSFET, a resistor having first and second terminals, the first terminal coupled to a drain of the p-channel MOSFET, and the second terminal coupled to a drain of the n-channel MOSFET, and a diode integrated with the resistor in a semiconductor layer and coupled in parallel, where at least a portion of the resistor includes or forms a p-n junction of the diode.

In a further aspect, a method of fabricating an electronic device includes forming a resistor in a semiconductor layer and forming a diode in the semiconductor layer. Forming the resistor includes forming a drift region including majority dopants of a first conductivity type in the semiconductor layer, forming first and second wells including majority carrier dopants of the first conductivity type in the semiconductor layer, the first and second wells extending to respective laterally opposite sides of the drift region, and forming first and second regions including majority dopants of the first conductivity type, the first region extending in the first well, and the second region extending in the second well, where at least a portion of the resistor includes or forms a p-n junction of the diode.

DETAILED DESCRIPTION

Figure 1:
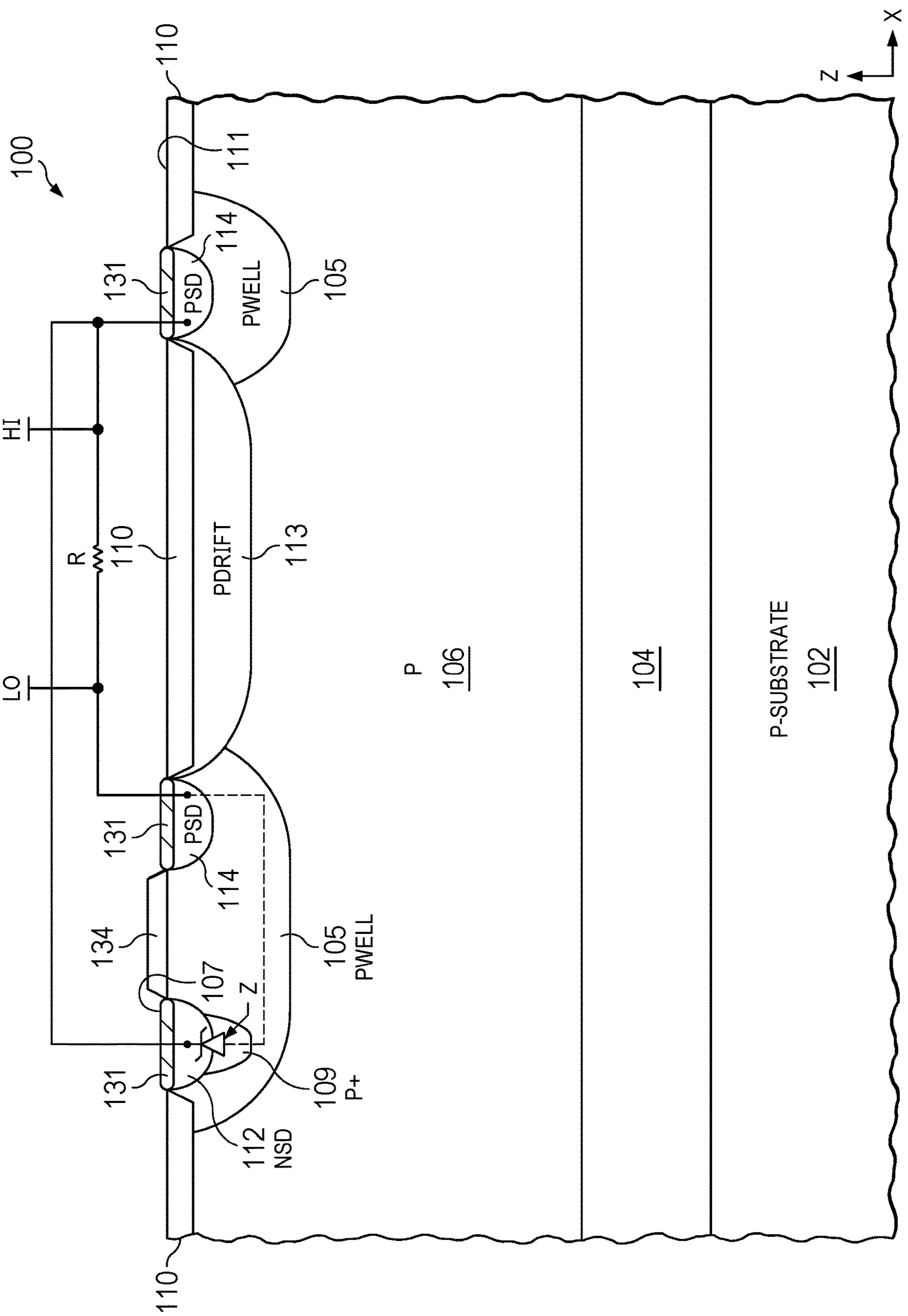
FIG. 1 is a partial sectional side elevation view of an electronic device with a resistor and an integrated Zener diode.

In the drawings, like reference numerals refer to like elements throughout, and the various features are not necessarily drawn to scale. Also, the term “couple” or “couples” includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, “about,” “approximately,” or “substantially” preceding a value means+/−10 percent of the stated value. One or more structures, features, aspects, components, elements, etc. may be referred to herein as first, second, third, etc., such as first and second terminals, first, second, and third wells, etc., for case of description in connection with particular drawings to arbitrarily distinguish between the elements such terms describe. Thus, these terms in the description and in the claims are not intended to indicate temporal or other prioritization of such elements, and such are not to be construed as limiting with respect to the claims.

Figure 1A:
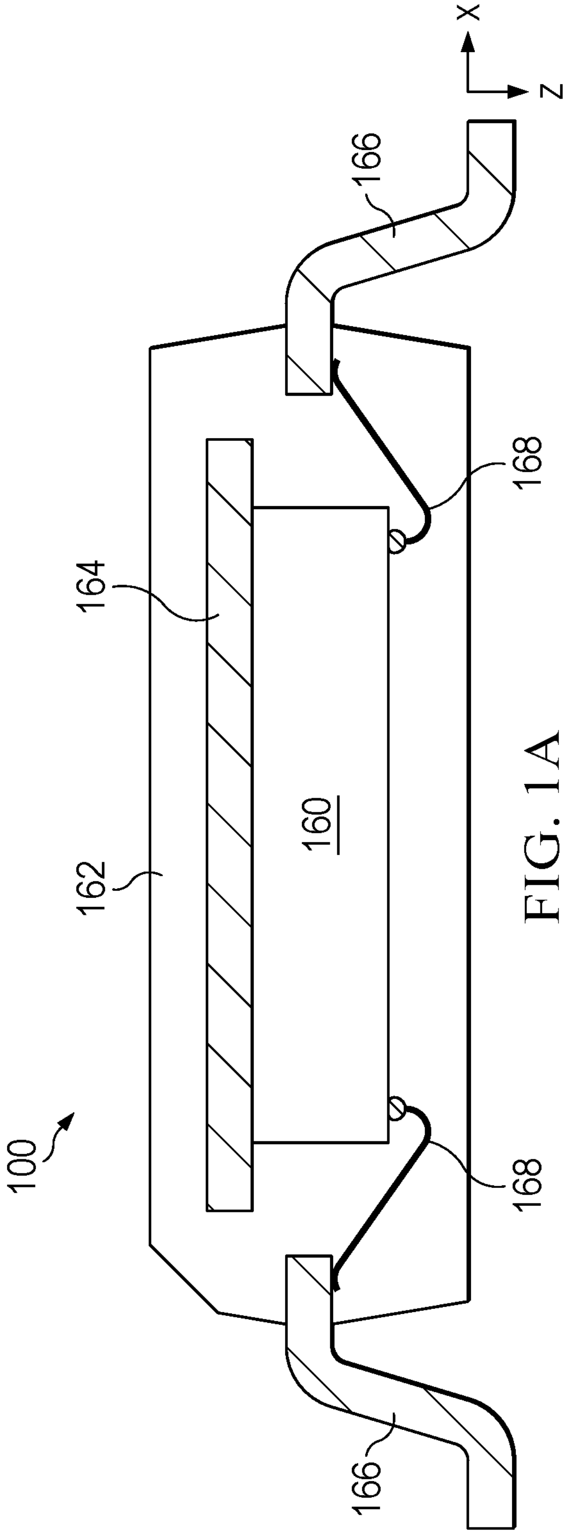
FIG. 1A is a sectional side elevation view of the electronic device of FIG. 1 including a package structure.
Figure 1B:
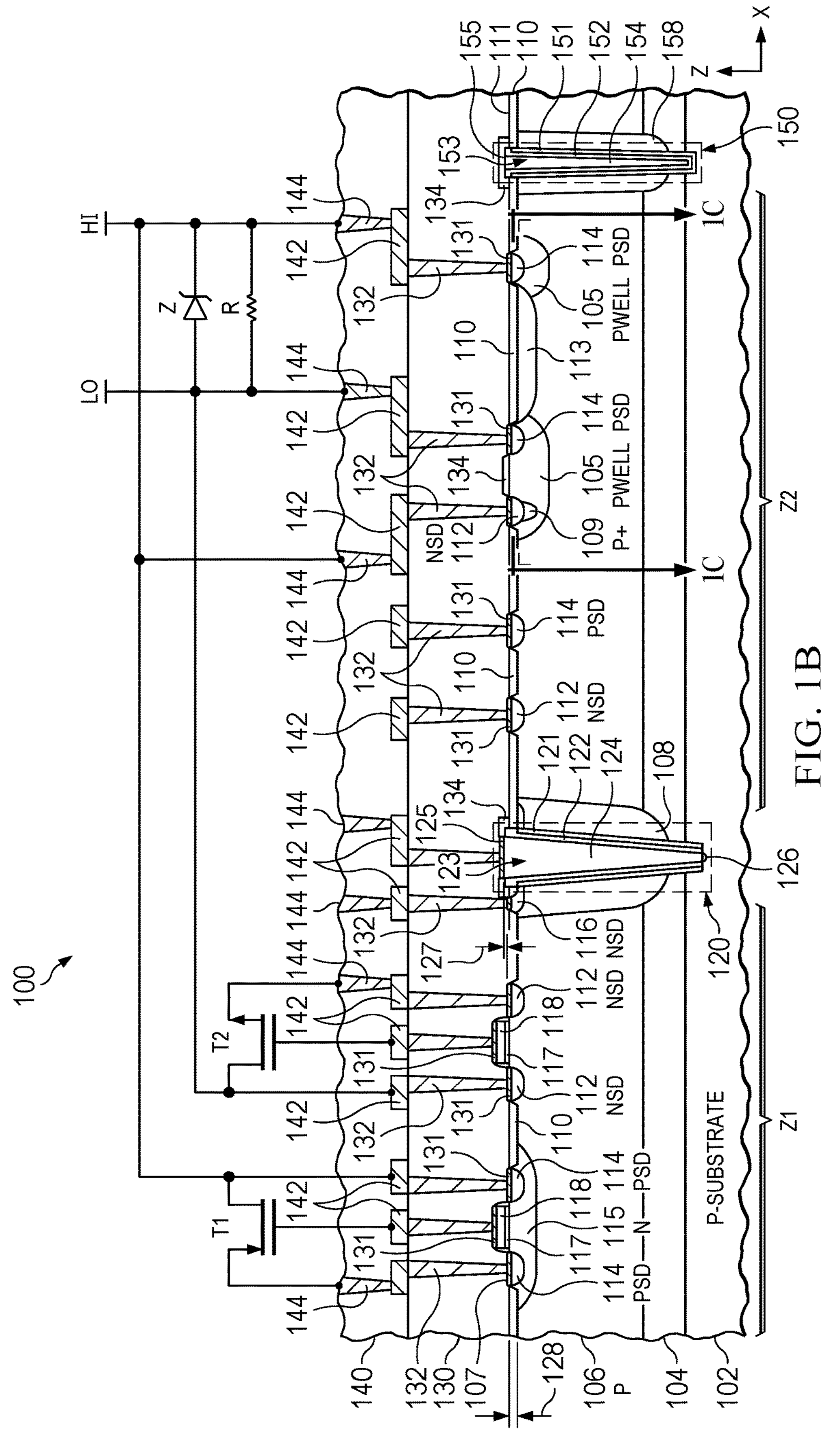
FIG. 1B is a partial sectional side elevation view of the electronic device of FIGS. 1 and 1A with the resistor and the integrated Zener diode connected in a half-bridge transistor circuit for linear region current matching.
Figure 1C:
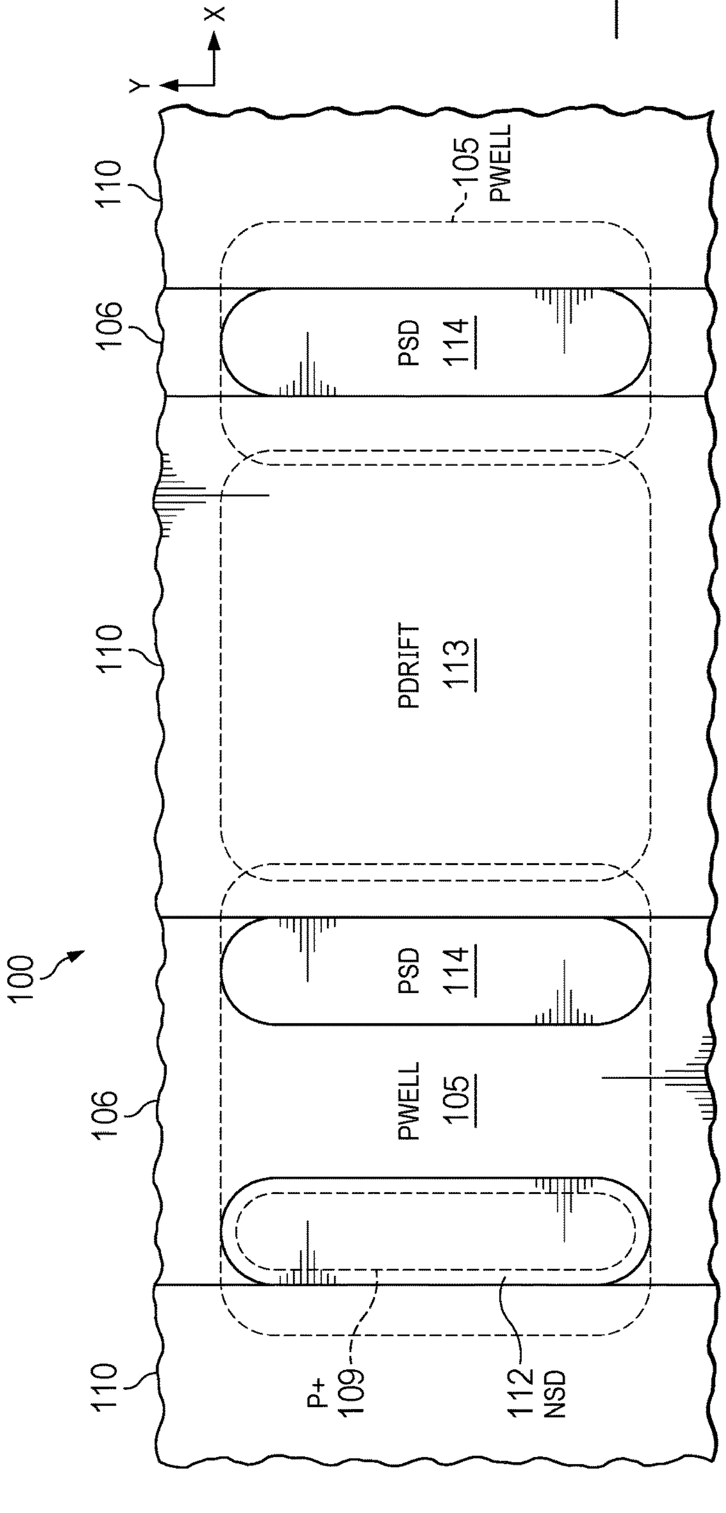
FIG. 1C is a partial sectional top plan view of the resistor and the integrated Zener diode taken along line 1C-1C of FIG. 1B.

Referring initially to FIGS. 1-1C, FIG. 1 shows a partial sectional side view of an electronic device 100, such as an integrated circuit with a resistor R and an integrated Zener diode Z in a unitary structure formed on or in a semiconductor structure. FIG. 1A shows a sectional side elevation view of the electronic device 100 with the integrated resistor R and diode Z in a package configuration, FIG. 1B shows another partial sectional side view of the electronic device 100 with the resistor R and the diode Z connected for linear region current matching in a half-bridge transistor circuit with a first transistor T1 and a second transistor T2, and FIG. 1C shows a partial sectional top view taken along line 1C-1C of FIG. 1B. As illustrated in FIGS. 1 and 1B (and FIGS. 1E, 1F, and 2), sectional side elevation views of electronic devices includes schematic circuit connections as solid lines above the semiconductor substrate. The schematic circuit connections show how various terminals and nodes of the electronic devices are coupled to each other to perform various functions described herein, and such connections can be established through multilevel metallization structures described herein—e.g., conductive routing structures 142, dielectric layer 140, and conductive vias 144 described with reference to FIG. 1B. The electronic device 100 is illustrated in an example position or orientation in a three-dimensional space with a first direction X, an orthogonal (e.g., perpendicular) second direction Y, and a third direction Z that is orthogonal (e.g., perpendicular) to the respective first and second directions X and Y, and structures or features along any two of these directions are orthogonal to one another.

Various disclosed devices and methods of the present disclosure may be beneficially applied for matching linear region current and limiting power dissipation in saturation region using a diode integrated with a resistor. While such examples may be expected to provide improvements in performance relative to baseline implementations, no particular result is a requirement unless explicitly recited in a particular claim. As described in more detail herein, integration of a diode and a resistor may include making a doped portion or region that forms a p-n junction within a doped well that includes or forms a portion or a terminal of the resistor in a semiconductor layer. Also, integration of a diode and a resistor may include making a doped well that includes or forms a portion or a terminal of the resistor on top of a doped layer in a semiconductor layer such that the doped well forms a p-n junction with the doped layer.

The electronic device 100 in one example is an integrated circuit product, only a portion of which is shown in FIG. 1. The electronic device 100 includes electronic components, such as transistors, resistors, capacitors fabricated on or in a semiconductor structure of a starting wafer, which is subsequently separated or singulated into individual semiconductor dies that are separately packaged to produce integrated circuit products. As shown in FIGS. 1 and 1B, the electronic device 100 includes a semiconductor structure that has a semiconductor substrate 102 (e.g., labeled "P-SUBSTRATE") and optionally has a buried oxide layer 104 on or in a portion of the semiconductor substrate 102. In other implementations, the buried oxide layer 104 can be omitted.

The electronic device 100 also includes wells 105 (e.g., labelled "PWELL" in FIGS. 1, 1B, and 1C) in a semiconductor layer 106 (e.g., labeled "P") with an upper or top side 107, as well as a deep doped region 108 (FIG. 1B). The semiconductor layer 106 may also be referred to as a semiconductor surface layer. In some examples, the wells 105 are formed by implantation process to introduce dopants in one or more selected regions (e.g., to dope the regions), and may also be referred to as implanted wells or doped wells. In one example, the wells 105 have majority carrier dopants of a first type (e.g., a first conductivity type) with majority carrier dopant concentrations in a range of approximately $1\times10^{15}$ to $1\times10^{17}$ $cm^{-3}$. As used herein, the enumerated dopant concentrations identify the peak concentration of the identified regions (e.g., wells) as the identified regions can have dopant concentration profiles that are not uniform. In some examples, the semiconductor layer 106 is an epitaxial layer and may be in-situ doped with a p-type dopant such as boron. The electronic device 100 also includes a doped region 109 (e.g., labeled "P+" in FIGS. 1, 1B, and 1C) within one of the wells 105. In some examples, the doped region 109 is formed by implantation process (to dope the region) and may also be referred to as an implanted region. In one example, the doped region 109 has majority carrier dopants of the first type with a majority carrier dopant concentration in a range of approximately $1\times10^{17}$ to $1\times10^{19}$ $cm^{-3}$.

The electronic device 100 includes a dielectric isolation layer 110 that includes portions that may be contiguous or noncontiguous. In the illustrated example, the dielectric isolation layer 110 is implemented as shallow trench isolation (STI) structures. Other examples may implement the dielectric isolation layer 110 using contiguous or noncontiguous local oxidation of silicon (LOCOS) structures. The following description refers to examples in which the dielectric isolation layer 110 is implemented with STI structures without implied limitation thereto and may refer to the dielectric isolation layer 110 as STI structures 110. As shown in FIGS. 1 and 1B, the STI structures 110 have upper or top surfaces 111 and extend into trenches in corresponding portions of the top side 107 of the semiconductor layer 106. In one example, the STI structures 110 are or include silicon dioxide ($SiO_2$).

The semiconductor substrate 102 in one example is a silicon or silicon on insulator (SOI) structure that include majority carrier dopants of a first conductivity type. In the illustrated implementation, the first conductivity type is p-type (having holes as majority charge carriers) and a second conductivity type is n-type (having electrons as majority charge carriers). In another implementation (not shown), the first conductivity type is n-type, and the second conductivity type is p-type. The semiconductor substrate 102 in one example includes a base silicon or silicon-on-insulator (SOI) wafer with an epitaxial silicon layer formed thereon. In one example, the semiconductor layer 106 is an epitaxial silicon layer that extends over the buried oxide layer 104. The semiconductor layer 106 in the illustrated example is or includes epitaxial silicon having majority carrier dopants of the first conductivity type and is labeled "P" in the drawings. The deep doped region 108 includes majority carrier dopants of the second conductivity type (e.g., a deep N region). The deep doped region 108 extends from the semiconductor layer 106 into the buried oxide layer 104. In another example, the deep doped region 108 extends through the buried oxide layer 104 and into the semiconductor substrate 102. In the illustrated example, the deep doped region 108 extends from the semiconductor layer 106 partially into the buried oxide layer 104 and does not extend into the underlying semiconductor substrate 102. In one example, the deep doped region 108 can be omitted.

A first doped region 112 (e.g., a first portion) of the semiconductor layer 106 along the top side 107 includes majority carrier dopants of the second conductivity type and is labeled "NSD" in FIGS. 1, 1B, and 1C. In some examples, the doped region 112 is formed by implantation process (to dope the region with the majority carrier dopants of the second conductivity type) and may also be referred to as an implanted region. In one example, the doped regions 112 have majority carrier dopant concentrations in a range of approximately $1\times10^{19}$ to $1\times10^{20}$ $cm^{-3}$. Other doped regions include second doped regions 114 (which may also be referred to as implanted regions 114) of the semiconductor layer 106 along the top side 107 including majority carrier dopants of the first conductivity type (e.g., labeled "PSD" in FIGS. 1, 1B, and 1C). In one example, the doped regions 114 have majority carrier dopant concentrations in a range of approximately $1\times10^{19}$ to $1\times10^{20}$ $cm^{-3}$. While the top side 107 is shown in the present example as the top surface of the second doped regions 114, for the purpose of this description and the claims the top side 107 includes the top surface of the semiconductor layer 106 and other doped regions such as the first doped region(s) 112 and second doped regions 114.

As shown in FIG. 1B, the electronic device 100 includes a first field effect transistor (FET) T1, and a second FET T2 formed on and/or in the semiconductor layer 106. The first transistor T1 is a p-channel field-effect transistor (FET), such as a p-channel metal-oxide-semiconductor field effect transistor (MOSFET) (e.g., a drain extended PMOS or DEPMOS transistor in one example) configured as a pull-up transistor in a half-bridge circuit. The first transistor T1 includes the doped regions 114 within an n-doped region 115 (e.g., a doped well of the second conductivity type), forming source/drains of the first transistor T1. As shown in FIGS. 1, 1B, and 1C, moreover, the resistor R includes another doped region 113, which may also be referred to as a drift region that includes majority carrier dopants of the first conductivity type and extends between the first and second wells 105 of the resistor R. In one example, the drift region 113 has a majority carrier dopant concentration that is less than the majority carrier dopant concentrations of the wells 105, for example, in a range of approximately $1\times10^{15}$ to $1\times10^{17}$ $cm^{-3}$. The second transistor T2 in this example is an n-channel FET, such as an n-channel MOSFET (e.g., a planar laterally double-diffused MOSFET or LDMOS) configured as a pull-down transistor in the half-bridge circuit with the resistor R and the diode Z coupled in parallel between the drains of the transistors T1 and T2.

The second transistor T2 includes the doped regions 112 within the semiconductor layer 106, forming source/drains of the second transistor T2. A doped portion 116 of the semiconductor layer 106 within the deep doped region 108 along the top side 107 includes majority carrier dopants of the second conductivity type and is labeled "NSD" in FIG. 1B, which may have substantially the same majority carrier dopant concentrations as the doped regions 112. As shown in FIG. 1B, the transistors T1 and T2 include corresponding gate oxide or gate dielectric structures 117 formed over channel regions between the source/drain (e.g., the doped regions 112, 114), as well as polysilicon gate electrodes 118 extending on the corresponding gate dielectric structures 117, which are spaced apart and above the respective transistor channel regions.

The resistor R operates to match the linear region current (e.g., Idlin) between the pull-up and pull-down transistors T1 and T2, and the integrated Zener diode Z limits the voltage across the resistor, for example, to control power consumption during saturation mode operation of the transistor T1 or T2. Moreover, the integration of the diode Z into or with the resistor R conserves area of the electronic device 100. As shown in FIGS. 1 and 1B-1D, the resistor R includes a first resistor terminal coupled to a high voltage node (e.g., labeled "HI" in FIGS. 1 and 1B), a second resistor terminal spaced apart from the first resistor terminal and coupled to a low voltage node (e.g., labeled "LO" in FIGS. 1 and 1B), and the drift region 113 that extends between the first and second resistor terminals. The first resistor terminal extends in a first well 105 in the semiconductor layer 106 and the second resistor terminal extends in a second well 105 in the semiconductor layer 106. The diode Z extends in the second well 105 in the semiconductor layer 106. The first resistor terminal includes a first doped region 114 in the semiconductor layer 106. The first doped region 114 extends in the first well 105 in the semiconductor layer 106. The first doped region 114 includes majority carrier dopants of the first conductivity type (e.g., p-type) and the first well 105 includes majority carrier dopants of the first conductivity type. The second resistor terminal includes a second doped region 114 in the semiconductor layer 106. The second doped region 114 extends in the second well 105 in the semiconductor layer 106. The second doped region 114 includes majority carrier dopants of the first conductivity type, and the second well 105 includes majority carrier dopants of the first conductivity type. The drift region 113 includes majority carrier dopants of the first conductivity type (e.g., p-type) and extends between the first and second wells 105.

The diode Z in this example is a Zener diode with an anode and a cathode. As shown in FIG. 1, the diode Z is located within the second well 105 and includes a doped region 109 (e.g., a third doped region) and another doped region 112 (e.g., a fourth doped region). The third doped region 109 is spaced apart from the second doped region 114 in the second well 105. The third doped region 109 includes majority carrier dopants of the first conductivity type (e.g., p-type). The interface between the third doped region 109 and the fourth doped region 112 provides a p-n junction of the Zener diode Z. The fourth doped region 112 abuts the third doped region 109 and includes majority carrier dopants of the second conductivity type (e.g., n-type). As shown in FIG. 1B and schematically in FIG. 1D, the cathode of the Zener diode Z (e.g., the fourth doped region 112) is coupled to a drain of the first transistor T1, the anode of the diode Z (e.g., the third doped region 109) is coupled to a drain of the second transistor T2, the first resistor terminal of the resistor R is coupled to the cathode of the diode Z, and the second resistor terminal of the resistor R is coupled to the anode of the diode Z.

The integrated resistor R and diode Z provides a compact resistor to provide linear region current matching for the transistors T1 and T2 and the resistor self-clamps (e.g., through the Zener diode Z limiting the voltage across the resistor R). This advantageously achieves on-state drain-source resistance (Rdson) matching during the linear mode operation of the pull-up and pull-down transistors T1 and T2 while limiting the power dissipation during the saturation mode operation of the pull-up or pull-down transistor T1 or T2 (e.g., through the Zener diode Z limiting the V*I power dissipation across the resistor R). The Zener diode Z is added (e.g., integrated) as part of the resistor structure, with the first terminal of the resistor R connected to the cathode as shown in schematic circuit connections depicted in FIGS. 1 and 1B. As described herein, the Zener diode Z includes the doped region 112 within the well 105 on one side of the resistor structure (e.g., integrated in or near the second resistor terminal). Moreover, the doped region 112 forms a p-n junction with the doped region 109 that provides a relatively high p-type dopant concentration (e.g., approximately $1\times10^{17}$ to $1\times10^{19}$ $cm^{-3}$ as described above, a p-type dopant concentration greater than the well 105) to set the Zener voltage of the Zener diode Z (e.g., a reverse bias breakdown voltage of the Zener diode).

In operation, when the voltage across the resistor R is greater than a threshold voltage (e.g., the reverse bias breakdown voltage of the Zener diode), Zener breakdown clamps the voltage across the high and low nodes (e.g., the voltage across the matching resistor R). In other words, the Zener diode conducts greater current than the resistor R. In some cases, the Zener diode conducts most of the current. When the voltage across the resistor R is less than the threshold voltage, the resistor R provides linear current matching with approximately linear I-V characteristics. In other words, the resistor R conducts greater current than the Zener diode. In some cases, the resistor R conducts most of the current. As shown in FIGS. 1 and 1B, the well 105 including the Zener diode also includes (e.g., is integrated with) the second resistor terminal. In another example, a separate well (e.g., a p-type well separate from the well 105) can be used to form the integrated Zener diode therein. The drift region 113 can be under the STI structure 110 or LOCOS or not under STI structure 110 or LOCOS in various implementations. An equivalent structure can be implemented by changing n-type dopants to p-type, and vice versa. Various implementations can use or include structure implemented in SOI, bulk silicon, or other semiconductor materials.

Figure 1D:
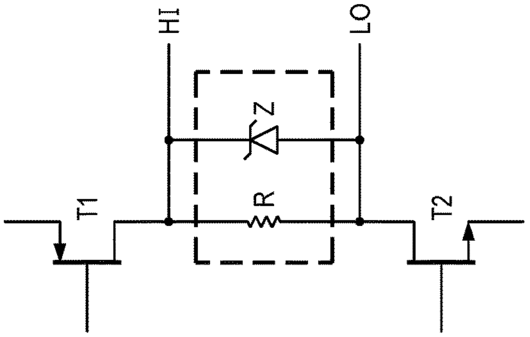
FIG. 1D is a schematic diagram of an electrical circuit including a half-bridge transistor circuit, a resistor and an integrated Zener diode for linear region current matching.

FIG. 1D shows a schematic diagram of an example electrical circuit including a half-bridge transistor circuit with the transistors T1 and T2, the resistor R and the integrated Zener diode Z for linear region current matching. The resistor R couples the drain of the first transistor T1 to the drain of the second transistor T2—i.e., the resistor R is between the drain of the first transistor T1 and the drain of the second transistor T2. The diode Z is integrated with the resistor R in the semiconductor layer 106 and coupled in parallel with the resistor R to limit a voltage across the resistor R. The cathode is coupled to the drain of the first transistor T1 and the anode is coupled to the drain of the second transistor T2. In one implementation, the circuit is an ultrasound pulser, a linear amplifier, or other analog half-bridge type circuit, and the resistor R is connected between the transistors T1 and T2 for linear mode current matching between the pull-up and pull-down paths, for example, to help match the greater linear mode Rdson of the first transistor T1 with the less Rdson of the second transistor T2, where the relative sizes of the transistors T1 and T2 can be designed to provide saturation mode current matching (e.g., Idsat) between the transistors T1 and T2. In this manner, good Idsat and Idlin matching can facilitate reducing signal distortion.

Ideally, a resistor has a zero voltage coefficient, as the voltage coefficient in a resistor tends to be detrimental to performance because it increases power dissipation V*I (i.e., increases V for the same I). Limiting the voltage across the resistor R (e.g., when the low side pull-down transistor T2 is in the saturation region) via the diode Z reduces the power dissipation. As such, low voltage coefficient resistors can be used in some examples, such as a polysilicon resistor, a SiCr resistor. The illustrated example uses a well resistor (which may also be referred to as a diffusion resistor) with the drift region 113 (e.g., a p-type doped region). In some examples, one or more implantation process steps can be used to concurrently form the drift region 113 and the first transistor T1—e.g., p-drift implant step used in forming the DEPMOS first transistor T1. Using one or more implantation process steps that are common between the resistor R and the transistor T1 or T2 may facilitate making the circuit less sensitive to process variations. For example, with process variations associated with the p-drift implant step increasing or decreasing the transistor Rdson, the p-drift implant step concurrently forming the resistor R (e.g., the drift region 113) results in the resistance of the resistor R to vary in a similar manner at the same time, thus providing automatic compensation or matching.

As shown in FIG. 1B, the electronic device 100 includes a wide first deep trench structure 120 (e.g., a deep trench isolation or DTI structure) that provides a top side electrical contact to the semiconductor substrate 102 between a first zone Z1 and a second zone Z2, as well as a second, narrower deep trench structure 150 (e.g., a DTI structure) that provides electrical isolation. In the illustrated example, the first and second transistors T1 and T2 are formed in the first zone Z1, and the resistor R is formed in the second zone Z2, although not a requirement of all possible implementations. The deep trench structure 120 includes a first dielectric liner 121 on a sidewall of a trench 123, and a second dielectric liner 122 on the first dielectric liner 121. The first and second dielectric liners 121, 122 may be referred to together as a bilayer dielectric liner. In one example, the first dielectric liner 121 is or includes a thermally grown silicon dioxide ($SiO_2$) of any suitable stoichiometry and thickness, and the second dielectric liner 122 is or includes a deposited silicon oxide ($SiO_x$) of any suitable stoichiometry and thickness. The first dielectric liner 121 may merge with the STI structure 110 abutting the deep trench structure 120, resulting in a continuous material layer as illustrated in FIG. 1B.

The deep doped region 108 surrounds the deep trench structure 120 in the example of FIG. 1B. In another implementation, a single layer dielectric liner (not shown) is formed along the trench sidewall. In another implementation, a multilayer dielectric liner (not shown) includes more than two dielectric layers along the trench sidewall. The trench 123 is filled with doped polysilicon 124. A top surface 125 of the deep trench structure 120 includes the topmost surface of the polysilicon 124 and the topmost surface of the second dielectric liner 122. The top surface 125 may be, and in the current example is shown as being, higher than the top surface 111 of the STI structure 110. The trench 123 in one example extends through the semiconductor layer 106 to the semiconductor substrate 102. In this implementation, the deep trench structure 120 extends through the semiconductor layer 106, through opposite upper and lower sides of the buried oxide layer 104 and into the underlying semiconductor substrate 102. In another implementation, the deep trench structure 120 extends into the buried oxide layer 104 but does not extend into the underlying semiconductor substrate 102. A contact 126 (formed by implantation process in some examples) to the semiconductor substrate 102 under the trench 123 includes majority carrier dopants of the first conductivity type. The bilayer dielectric liner 121, 122 extends on the sidewall of the trench 123 from the semiconductor layer 106 to the buried oxide layer 104 and into the semiconductor substrate 102. The bilayer dielectric liner 121, 122 isolates the polysilicon 124 from the semiconductor layer 106.

The polysilicon 124 includes majority carrier dopants of the first conductivity type. The polysilicon 124 extends on the dielectric liner 122 and fills the trench 123 to above the top side 107 of the semiconductor layer 106. In the example of FIG. 1B, the trench 123, the dielectric liner 122, and the polysilicon 124 extend beyond the top side 107 of the semiconductor layer 106 through a portion of the STI structure 110. A portion (e.g., side) of the STI structure 110 contacts (e.g., touches) a portion of the deep trench structure 120. The top surface 125 of the deep trench structure 120 extends upward beyond the top side 107 of the semiconductor layer 106 by a first distance 127, and the top surface 111 of the STI structure 110 extends upward beyond the top side 107 of the semiconductor layer 106 by a second distance 128.

The deep trench structure 120 and a narrower deep trench structure 150 in the electronic device 100 of FIG. 1B are fabricated after formation (e.g., growth or deposition) of the STI structure 110, and the first distance 127 is greater than the second distance 128 in the electronic device 100 of FIG. 1B (e.g., the polysilicon 124 extends upward past and above the top surface 111 of the STI structure 110 in the configuration and orientation shown in FIG. 1B). In one example, the deep trench structure 120 can be formed before, or concurrently, with trench structure 123. In one example, the deep trench structure 120 extends in two dimensions to laterally encircle or surround one or both of the zones Z1 and/or Z2, and the electronic device 100 can have any suitable number of isolated zones (not shown) surrounded by similar deep trench structures 120. The electronic device 100 can include any number of electronic circuit components, such as transistors (e.g., T1 and T2), resistors (e.g., resistor R), capacitors, diodes (e.g., Zener diode Z), etc. interconnected to form electrical circuits in one or more isolated regions, and the circuits of two or more isolated regions can be interconnected, for example, through openings in the deep trench structure or structures and/or by metallization routing interconnections.

The electronic device 100 includes a multilevel metallization structure, a portion of which is shown in FIG. 1B. The electronic device 100 includes a first dielectric layer 130 (e.g., a pre-metal dielectric layer labeled "PMD" in FIG. 1B) that extends on or over the STI structures 110 and portions of the top side 107 of the semiconductor layer 106 and over the top of the deep trench structure 120. In one example, the first dielectric (PMD) layer 130 is or includes $SiO_2$. The PMD layer 130 includes conductive contacts 132 that extend through the PMD layer 130 to form electrical contacts to the respective source/drain regions 112 and 114 of the semiconductor layer 106. Select portions of the top sides of the transistor polysilicon gate, the source/drain regions 112 and 114, and the polysilicon 124 of the wide deep trench structure 120 are silicided to form a metal silicide 131. The metal silicide 131 can include titanium silicide, cobalt silicide or other metal silicide (e.g., a refractory metal silicide). The PMD layer 130 also includes a conductive contact 132 that forms an electrical (ohmic) contact to the doped polysilicon 124 along the top surface 125 of the deep trench structure 120, as well as a separate, optional conductive contact 132 that forms an electrical contact to the doped region 116 that encircles the top of the deep trench structure 120 in the deep doped region 108 as shown in FIG. 1B. In one example, the conductive contacts 132 are or include tungsten.

A silicide blocking layer 134 (SiBLK) extends on a portion of the top surface 125 of the first deep trench structure 120. The silicide blocking layer 134 in one example is a nitrogen-containing dielectric material that may include silicon nitride (SiN) or silicon oxynitride (e.g., SiON) of any suitable stoichiometry and thickness. In other examples, the silicide blocking layer 134 is or includes silicon oxide (e.g., $SiO_x$) of any suitable stoichiometry and thickness. The silicide blocking layer 134 in one example covers the dielectric liners 121 and 122 of the first deep trench structure 120 and covers a first portion of the polysilicon 124 along edges thereof, while exposing (i.e., not covering) a second portion of the polysilicon 124 of the first deep trench structure 120. The metal silicide 131 extends on the portion of the polysilicon 124 at the top surface 125 of the first DTI structure 120, and a respective conductive metal contact 132 contacts the metal silicide 131 on the portion of the polysilicon 124 of the deep trench structure 120. The contact 132 extends through the pre-metal dielectric layer 130 to the metal silicide 131 and the pre-metal dielectric layer 130 covers the silicide blocking layer 134. The silicide blocking layer 134 can help mitigate or avoid unwanted silicidation at the edges of polysilicon 124 on wide deep trench structures such as the first deep trench structure 120 and reduce or eliminate non-planar surface features at the interface between deep trench liner oxide 121 and the polysilicon 124 used to form an electrical contact to the buried oxide layer 104 and/or the substrate 102.

The multilevel metallization structure in this example also includes a second (e.g., interlayer or interlevel) dielectric layer 140 (e.g., $SiO_x$), which is labeled "ILD" in FIG. 1B. The second dielectric layer 140 includes conductive routing structures 142, such as conductive metal traces or lines. In one example, the conductive routing structures 142 are or include copper or aluminum or aluminum or other conductive metal. The second dielectric layer 140 includes conductive vias 144 that are or include copper or aluminum or other conductive metal. In one example, the electronic device 100 includes one or more further metallization layers or levels (not shown).

As further shown in FIG. 1B, the electronic device 100 also includes the narrow second deep trench structure 150 having a bilayer liner 151 and 152 along the bottom and sidewalls of a second trench 153. In one example, the first dielectric liner 151 is or includes a thermally grown silicon dioxide ($SiO_2$) of any suitable stoichiometry and thickness, and the second dielectric liner 152 is or includes a deposited silicon oxide ($SiO_x$) of any suitable stoichiometry and thickness. The second deep trench structure 150 includes polysilicon 154 that may also be referred to herein as a core or "second core." The second deep trench structure 150 is laterally narrower than the first deep trench structure 120. The polysilicon 154 in the second deep trench structure 150 can be electrically floating with respect to one or more circuits of the electronic device and/or the substrate 102. In another implementation, the polysilicon can be omitted in the second deep trench 150, and silicon dioxide is used instead to fill the second deep trench. The second trench 153 in the example of FIG. 1 is filled with the polysilicon 154 and has an upper or top surface 155. A portion of the second deep trench structure 150 is surrounded by a second deep doped region 158 having majority carriers of the second type (e.g., n-type). In another example, the second deep doped region 158 can be omitted. The second deep trench structure 150 extends through a second portion of the STI structure 110, through the semiconductor layer 106, and into the buried oxide layer 104. The top surface 155 of the second deep trench structure extends above the top surface 111 of the second portion of the associated STI structure 110 by the distance 127. In addition, a second silicide blocking layer 134 extends on and covers the top surface 155 of the second deep trench structure 150, covering the bilayer liner 151 and 152 and the polysilicon 154 along the top surface 155. The second silicide blocking layer 134 in one example is or includes silicon oxynitride (e.g., SiON) of any suitable stoichiometry and thickness. In another example, the second silicide blocking layer 134 is or includes silicon oxide (e.g., $SiO_x$) of any suitable stoichiometry and thickness. The second silicide blocking layer 134 in one example prevents silicidation of the polysilicon 154 of the second deep trench structure 150 and facilitates electrically floating isolation during operation of the electronic device 100. In situations where the second deep trench does not contain polysilicon, silicide and silicide blocking layers may be omitted.

In one example, the resistor R includes a second terminal extended in a second well 105 (e.g., the left-most well instance 105 in FIG. 1) in the semiconductor layer 106, where the second well 105 includes majority dopants of the first conductivity type (e.g., p-type), and the p-n junction of the diode Z is located in the second well 105. The diode Z in this example includes a region 109 (e.g., a first region) and a region 112 (e.g., a second region) in the second well 105, and an interface between the first and second regions 109 and 112 forms the p-n junction of the diode Z. The second region 112 in this example extends from a surface of the semiconductor layer 106 and abuts the first region 109 disposed below the second region 112. The first region 109 includes majority dopants of the first conductivity type and the second region 112 includes majority dopants of the opposite second conductivity type. In this example, moreover, the second terminal of the resistor R includes a third region 114 in the second well 105 that is spaced apart from the first and second regions 109 and 112 and includes majority dopants of the first conductivity type. The resistor R further includes a first terminal extended in a first well 105 in the semiconductor layer 106 (e.g., the right-most well instance 105 in FIG. 1) and the first terminal is spaced apart from the second terminal. The doped region 113 (e.g., the drift region) extends between the first and second terminals of the resistor R, and the doped region 113 has majority dopants of the first conductivity type. Moreover, the second region 112 of the diode Z (e.g., cathode of the diode Z) is coupled to the drain of the p-channel MOSFET T1 and to the first terminal of the resistor R, and the first region 109 of the diode Z (e.g., anode of the diode Z) is coupled to the drain of the n-channel MOSFET T2 and to the second terminal of the resistor R.

As further shown in FIG. 1A, the finished electronic device 100 in one example includes a package structure having a semiconductor die 160 enclosed in a molded package 162. The semiconductor die 160 includes the integrated resistor R and the diode Z described herein. In the illustrated example, the semiconductor die 160 is mounted on a conductive metal die attach pad 164, and conductive bond pads of the die 160 are electrically coupled to respective leads 166 via conductive bond wires 168 to form electrical connections to external circuitry, for example, of a printed circuit board (PCB, not shown) to which the packaged electronic device 100 may be attached. As described herein, the semiconductor die 160 includes the integrated resistor R and the diode Z, and thus the finished electronic device 100 provides the linear region current matching capability and the self-clamping capability without any external component added thereto, among other functions the electronic device 100 is designed for.

Figure 1E:
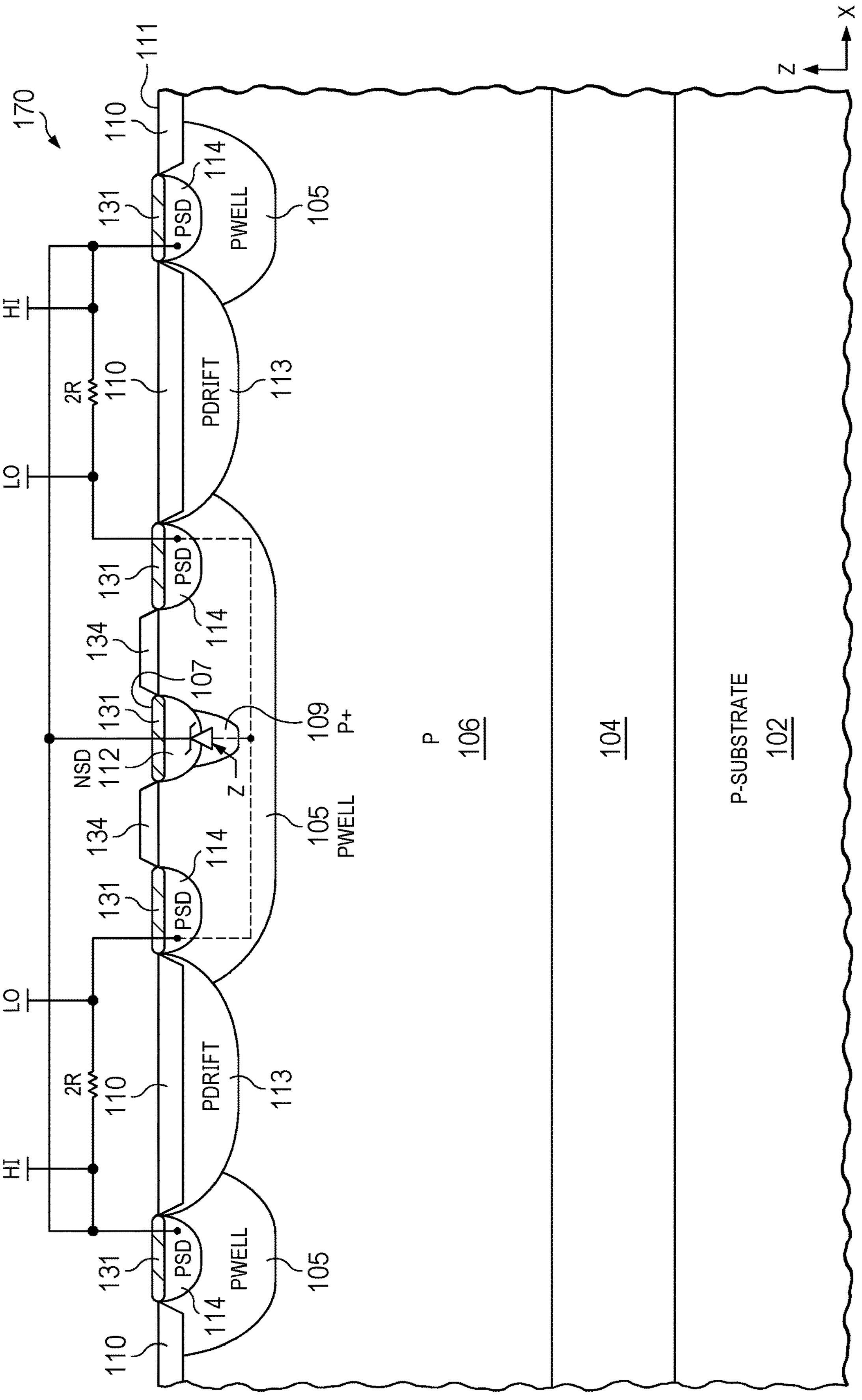
FIG. 1E is a partial sectional side elevation view of a symmetrical implementation of the resistor and the integrated Zener diode.
Figure 1F:
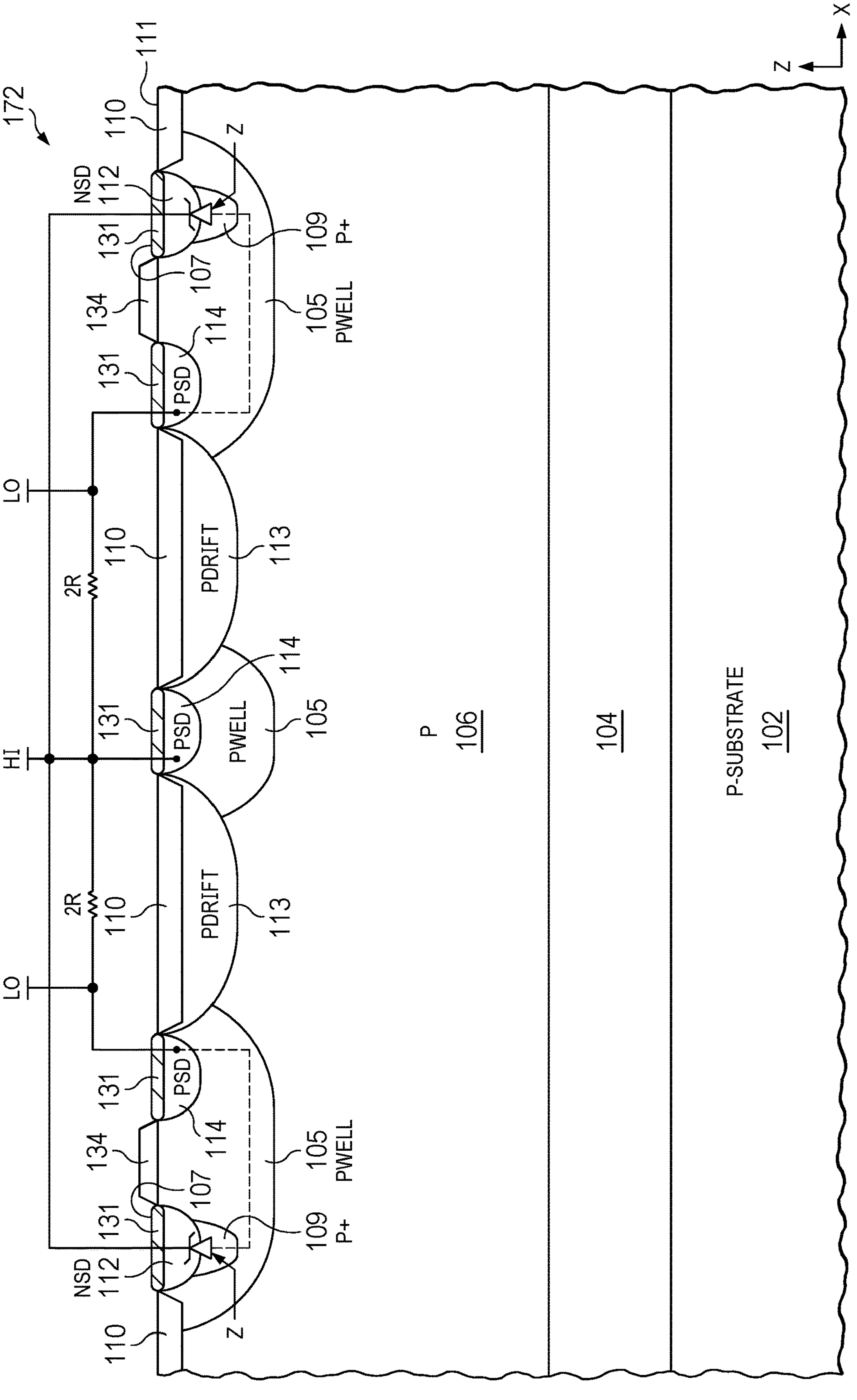
FIG. 1F is a partial sectional side elevation view of another symmetrical implementation of the resistor and the integrated Zener diode.

FIG. 1E shows a partial sectional side view of a symmetrical implementation 170 of the resistor and integrated Zener diode Z, in which the Zener diode is located laterally approximately midway between parallel connected resistor structures (e.g., labeled "2R"). FIG. 1F shows a partial sectional side view of another symmetrical implementation 172 of the resistor and integrated Zener diode Z, in which a first Zener diode is located at a first side of the parallel connected resistor structures (e.g., labeled "2R") and a second Zener diode is located at a second side of the parallel connected resistor structures opposite the first side. These examples and other different designs can be implemented including lateral parallel interconnections of resistive structures, such as the illustrated drift regions 113 to implement the resistor with integration of the diode laterally between the resistor portions, as well as encircling structures such as a racetrack structure with a drift region 113 that laterally encircles the integrated diode.

Figure 1G:
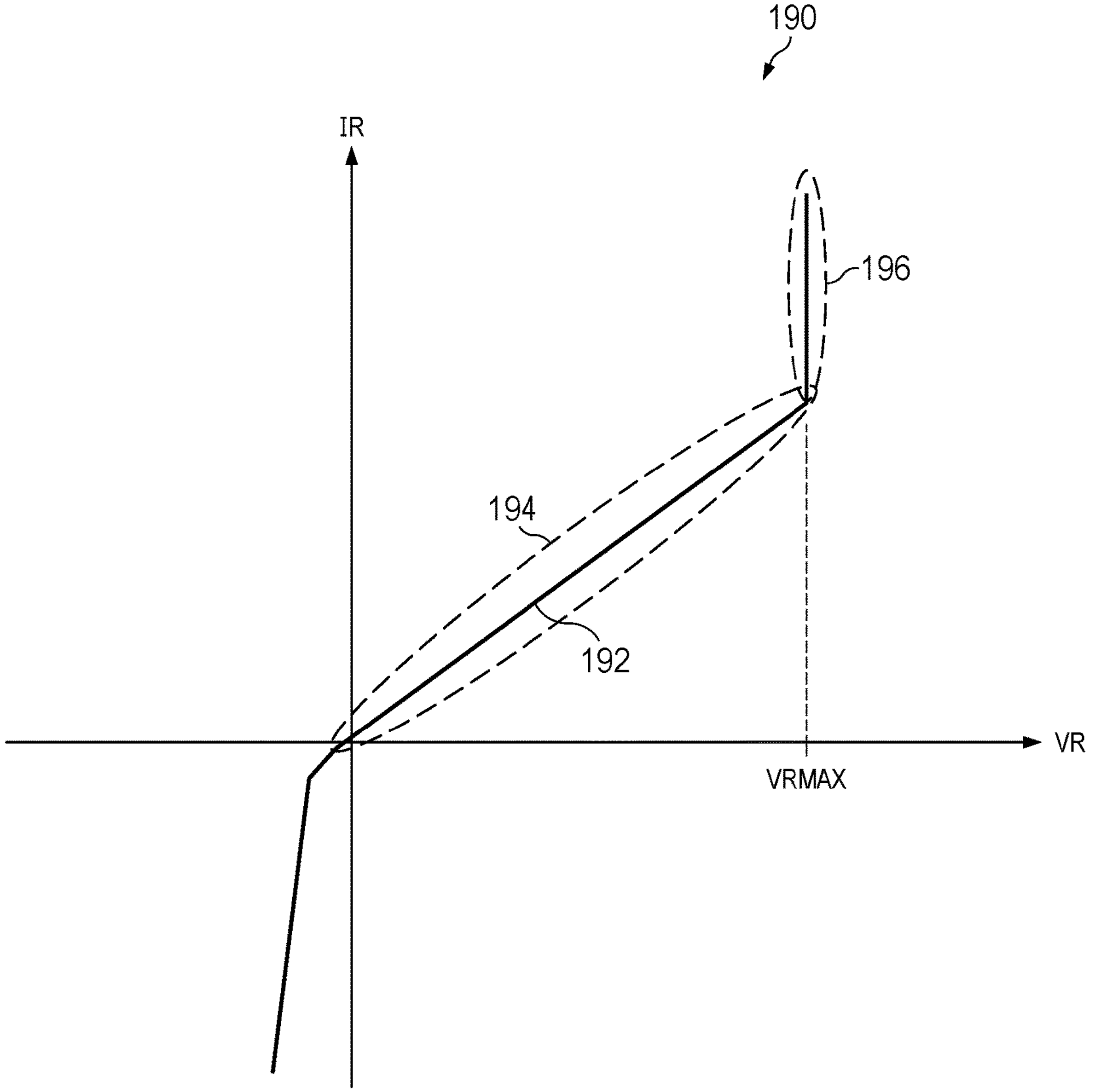
FIG. 1G is a current and voltage graph of an example implementation of the resistor and the integrated Zener diode of FIG. 1.

FIG. 1G shows a graph 190 with a current (IR) and voltage (VR) curve 192 of an example implementation of the resistor R and integrated Zener diode Z of FIGS. 1-1F. The example curve 192 shows a first region 194 with approximately linear resistor current response IR for positive resistor voltage VR (e.g., the voltage of the HI node relative to the LO node in the circuit of FIG. 1D such that the Zener diode Z is under a reverse bias condition) below a maximum clamped voltage level labeled "VRMAX" (e.g., in a range of approximately 1 to 7 volts in one implementation). The integrated resistor/diode provides resistive linear region current matching (e.g., Idlin) in the first region 194. The maximum clamped voltage level VRMAX is approximately equal to the Zener voltage of the Zener diode Z (e.g., the reverse bias breakdown voltage). As the resistor voltage increases to (or surpasses) the Zener voltage (e.g., VRMAX), the diode Z conducts larger current in a second region 196 such that the Zener diode Z provides a current shunt path to limit the voltage drop across the resistor—e.g., when the second transistor T2 (or the first transistor T1) is operating in the saturation region. In one example, the first transistor T1 is a p-channel MOSFET, such as a DEPMOS pull-up transistor in an amplifier half-bridge circuit and the second transistor T2 is an LDMOS pull-down device. The resistor R is coupled between the drains of the transistors T1 and T2 in the current path so that the Rdson of the DEPMOS first transistor T1 is better matched to that of the LDMOS transistor T2 (at least partially due to the resistor R) in order to reduce distortion and to achieve symmetrical waveforms when the p-channel MOSFET T1 and the n-channel MOSFET T2 are operating in the linear region. The resistor R and the diode D are connected in parallel between the transistor drains, where the resistor R conducts greater current than the diode Z when the voltage VR across the resistor R is less than a threshold value (e.g., VRMAX in FIG. 1G) and the diode Z conducts greater current than the resistor R when the voltage VR across the resistor R is equal to or greater than the threshold value. In one implementation, the resistor R conducts greater current than the diode Z when the respective p-channel and n-channel MOSFETs T1 and T2 are in a linear operation mode, and the diode Z conducts greater current than the resistor R when the respective p-channel or n-channel MOSFET T1 or T2 is in a saturation operation mode.

Absent the Zener diode Z (or a p-n diode described with reference to FIGS. 2-2B) providing a current shunt path, when the transistors T1 and/or T2 are in saturation, they behave like current sources, resulting in large power dissipation in the matching resistor R, while the resistor is not contributing to any current matching need between the pull-up or pull-down transistors, as the saturation currents are already matched by the size ratio between the transistors T1 and T2 chosen in the design. In the illustrated examples, the diode Z limits the resistor voltage (e.g., VR in FIG. 1G) to the maximum value VRMAX set by the Zener voltage of the diode Z. The integrated resistor and diode self-clamps its voltage VR in the second region 196 while offering the linear I-V relationship at low voltage/current in the first region 194. The described examples provide utility and benefits for matching Rdson between the pull-up and pull-down current paths in a circuit by integrating the resistor with a built-in p-n diode or Zener diode in a unitary structure.

The self-clamping integrated resistor and diode advantageously reduces power dissipation when the pull-up or pull-down transistor is in saturation during operation in the second region 196 in FIG. 1G. At low voltage/current (e.g., in the first region 194 in FIG. 1G), conduction in the resistor R dominates, resulting in a linear I-V characteristic and good Idlin matching performance. At high voltage and current (e.g., the second region 196), conduction in the Zener diode Z dominates, resulting in a rapid increase in current, effectively limiting the voltage VR between the HI and LO nodes in the example half bridge circuit of FIG. 1D. In one example Zener implementation, the Zener diode Z has a junction formed by the first doped region 112 (e.g., having a doping concentration between $1\times10^{19}$ to $1\times10^{20}$ $cm^{-3}$) along with the doped region 109 (e.g., having a doping concentration between $1\times10^{17}$ to $1\times10^{19}$ $cm^{-3}$) on one side or terminal of the resistor R with a metal line connected to the other terminal. This implementation facilitates Zener breakdown at a high enough resistor voltage VR where linear resistance is not needed, while at a lower voltage (e.g., region 194 in FIG. 1G), the conduction in the resistor dominates. Another implementation can provide a suitable self-clamped resistor structure by changing n-type to p-type, and vice versa, and different structure can be implemented in SOI, bulk silicon, or other semiconductor materials.

Figure 2:
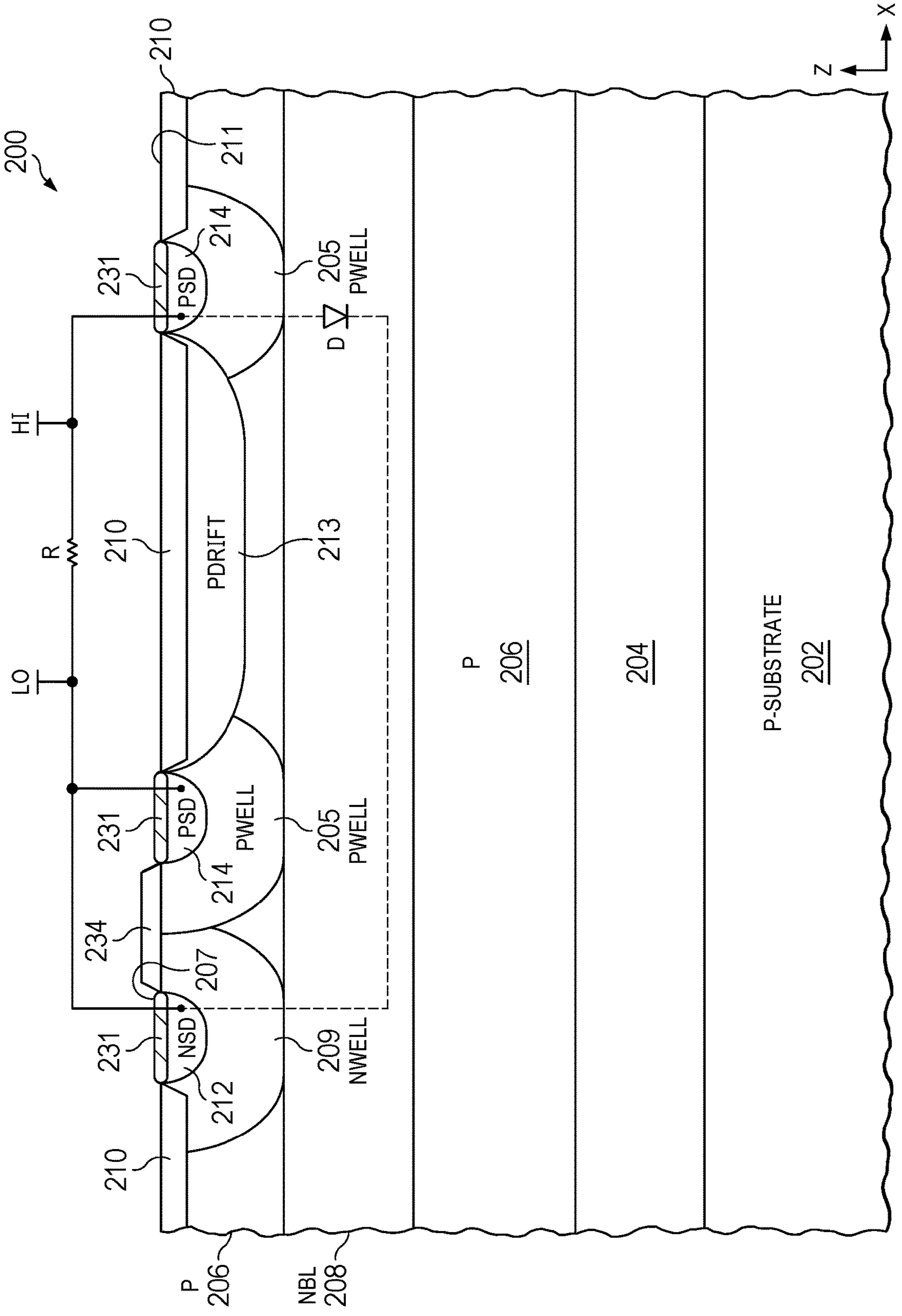
FIG. 2 is a partial sectional side elevation view of another electronic device with a resistor and an integrated p-n junction diode.
Figure 2A:
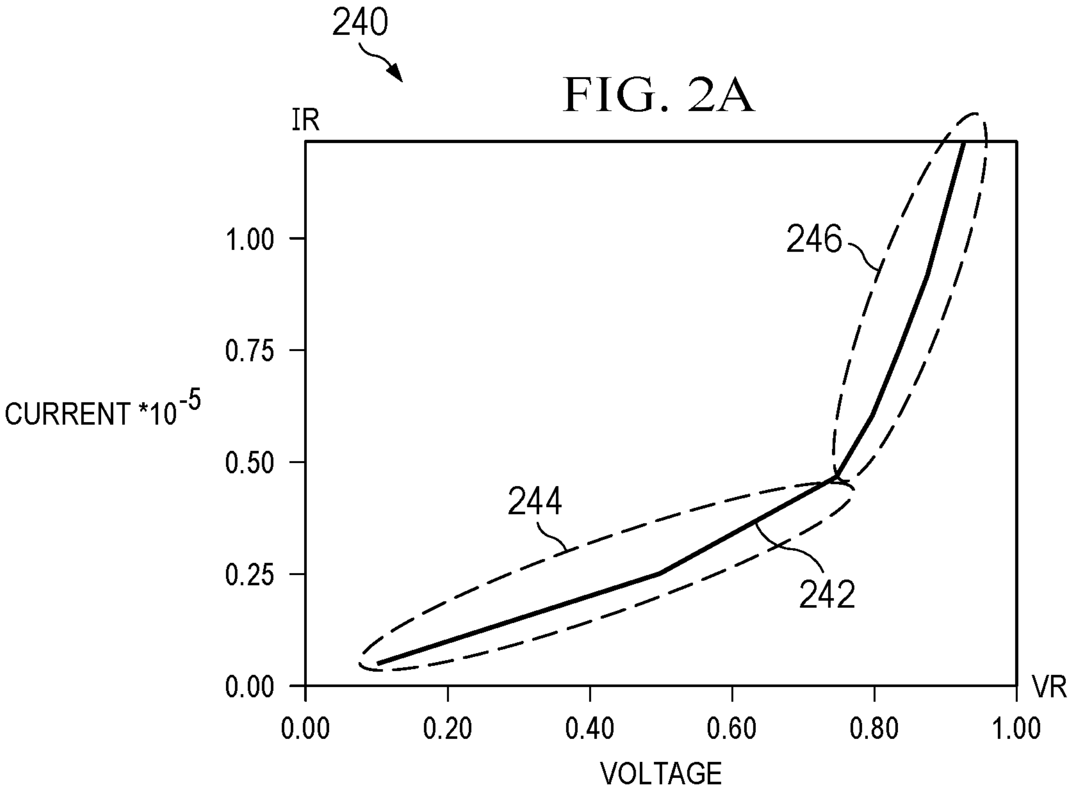
FIG. 2A is a current and voltage graph of an example implementation of the resistor and the integrated p-n junction diode of FIG. 2.
Figure 2B:
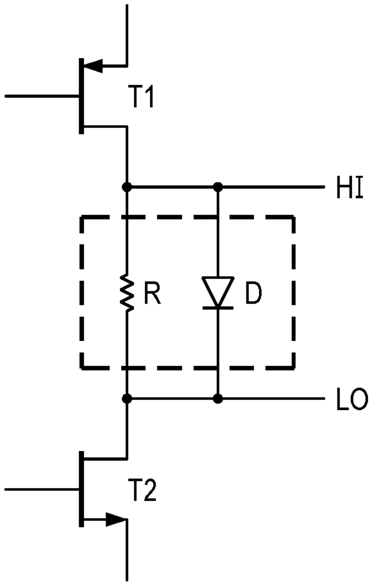
FIG. 2B is a schematic diagram of an electrical circuit including a half-bridge transistor circuit, a resistor and an integrated p-n junction diode for linear region current matching.

FIGS. 2-2B illustrate another example electronic device 200 having a resistor R and an integrated diode D, in this case, a p-n junction diode. FIG. 2 shows a partial sectional side view of the electronic device 200, FIG. 2A shows a current and voltage graph of an example implementation of the resistor and integrated p-n junction diode of FIG. 2, and FIG. 2B shows a schematic diagram of an electrical circuit including a half-bridge transistor circuit, a resistor and an integrated p-n junction diode for linear region current matching. As shown in FIG. 2, the electronic device 200 includes a semiconductor structure that has a semiconductor substrate 202 (e.g., labeled "P-SUBSTRATE," which may include aspects of the semiconductor substrate 102) and optionally has a buried oxide layer 204 on or in a portion of the semiconductor substrate 202. In other implementations, the buried oxide layer 204 can be omitted. In one example, the electronic device 200 also includes first and second transistors, for example, T1 and T2 as described above in connection with the electronic device 100 of FIG. 1B.

The electronic device 200 in FIG. 2 also includes wells 205 (e.g., labelled "PWELL" in FIG. 2, which may include aspects of the wells 105) in a semiconductor layer 206 (e.g., labeled "P." which may include aspects of the semiconductor layer 106) with an upper or top side 207, as well as a buried layer 208 (e.g., labelled "NBL" in FIG. 2) that is spaced apart from the top side 207 in the semiconductor layer 206. In one example, the buried layer 208 has majority carrier dopants of the second type with a majority carrier dopant concentration in a range of approximately $1\times10^{15}$ to $1\times10^{19}$ $cm^{-3}$. In one example, the wells 205 have majority carrier dopants of the first type with majority carrier dopant concentrations in a range of approximately $1\times10^{15}$ to $1\times10^{17}$ $cm^{-3}$. In some examples the semiconductor layer 206 is an epitaxial layer and may be in-situ doped with a p-type dopant such as boron. The electronic device 200 also includes a region 209 (e.g., a third well labelled "NWELL" in FIG. 2, which may also be referred to as an implanted region, a doped region, or well) alongside one of the wells 205. In one example, the region 209 has majority carrier dopants of the second conductivity type and a majority carrier dopant concentration in a range of approximately $1\times10^{15}$ to $1\times10^{18}$ $cm^{-3}$. As shown in FIG. 2, the third well 209 extends between a surface of the semiconductor layer 206 and the buried layer 208. In this example, the third well 209 is spaced apart from a first well 205 (e.g., the right-most well instance 205) and laterally abuts a second well 205 (the left-most well instance 205).

The resistor R in this example includes a first resistor terminal, a second resistor terminal spaced apart from the first resistor terminal, and a drift region 213 (which may include aspects of the drift region 113) that extends between the first and second resistor terminals. The first resistor terminal extends in the first well 205 that includes majority carrier dopants of the first conductivity type (e.g., p-type) in the semiconductor layer 206 and the second resistor terminal extends in the second well 205 including majority carrier dopants of the first conductivity type in the semiconductor layer 206. The diode D includes the buried layer 208 spaced apart from the top side or surface 207 of the semiconductor layer 206, and the buried layer 208 includes majority carrier dopants of the second conductivity type (e.g., n-type), where a portion of the buried layer 208 contacts a portion of the first well 205 to form a p-n junction of the diode D.

The electronic device 200 includes a dielectric isolation layer 210 (which may include aspects of the dielectric isolation layer 110) that includes portions that may be contiguous or noncontiguous. In the illustrated example the dielectric isolation layer 210 is implemented as shallow trench isolation (STI) structures with upper or top surfaces 211. Other examples may implement the dielectric isolation layer 210 using contiguous or noncontiguous local oxidation of silicon (LOCOS) structures. The electronic device 200 includes a first doped region 212 (which may include aspects of the doped region 112) (e.g., a first portion, which may also be referred to as an implanted region) of the semiconductor layer 206 along the top side 207 includes majority carrier dopants of the second conductivity type and is labeled "NSD" in FIG. 2. In one example, the doped region 212 has a majority carrier dopant concentration in a range of approximately $1\times10^{19}$ to $1\times10^{20}$ $cm^{-3}$. The resistor R includes a drift region 213 (which may include aspects of the drift region 113) that has majority carrier dopants of the first conductivity type (e.g., p-type) and extends between the first and second wells 205 of the resistor R. In one example, the drift region 213 has a majority carrier dopant concentration that is less than that of the wells 205, such as in a range of approximately $1\times10^{15}$ to $1\times10^{17}$ $cm^{-3}$.

Other regions of the electronic device 200 include second doped regions 214 (which may include aspects of the doped region 114) of the semiconductor layer 206 along the top side 207 including majority carrier dopants of the first conductivity type (e.g., labeled "PSD" in FIG. 2). In one example, the doped regions 214 have majority carrier dopant concentrations in a range of approximately $1\times10^{19}$ to $1\times10^{20}$ $cm^{-3}$. While the top side 207 is shown in the present example as the top surface of the second implanted regions 214, for the purpose of this description and the claims the top side 207 includes the top surface of the semiconductor layer 206 and other implanted regions such as the first doped region(s) 212 and second doped regions 214. In one example, the electronic device 200 includes metal silicide structures 231, optional silicide blocking structures 234 that can be the same or similar to the respective structures 131 and 134 described above, as well as other structures not shown in the illustrated portion of FIG. 2 (e.g., deep trench isolation or deep trench contact structures, etc.). In the illustrated implementation, the first conductivity type is p-type and a second conductivity type is n-type. In another implementation (not shown), the first conductivity type is n-type, and the second conductivity type is p-type. An equivalent structure can be implemented by changing n-type dopants to p-type, and vice versa. Various implementations can use or include structure implemented in SOI, bulk silicon, or other semiconductor materials.

As further shown in FIGS. 2A and 2B, in powered operation, the integrated resistor R helps match the linear region current (e.g., Idlin) between the pull-up and pull-down transistors T1 and T2 when connected in the circuit configuration of FIG. 2B. In addition, the integrated p-n junction diode D limits the voltage across the resistor R, for example, to control power consumption during saturation region operation. Moreover, the integration of the diode D into or with the resistor R conserves area in the electronic device 200. As shown in FIG. 2, the resistor R includes a first resistor terminal coupled to a high voltage node (e.g., labeled "HI" in FIGS. 2 and 2B), a second resistor terminal spaced apart from the first resistor terminal and coupled to a low voltage node (e.g., labeled "LO" in FIGS. 2 and 2B), and the drift region 213 that extends between the first and second resistor terminals. The first resistor terminal extends in the first well 205 in the semiconductor layer 206 and the second resistor terminal extends in the second well 205 in the semiconductor layer 206.

In this example, at least a portion of the resistor R includes or forms a p-n junction of the diode. The first resistor terminal is extended in a first well 205 in the semiconductor layer that includes majority dopants of the first conductivity type (e.g., p-type), and the diode D includes the buried layer 208 with majority dopants of the second conductivity type disposed below the first well 205 and abutting the first well 205. The interface between the buried layer 208 and the first well 205 forms the p-n junction of the diode D. As schematically shown in FIG. 2, one instance of the wells 205 (e.g., the first well 205) that forms a resistor terminal at least partially includes or forms a p-n junction of the diode D. The diode D in this example is a p-n junction diode with an anode in the right-most well 205 (e.g., the first well 205) in FIG. 2 and a cathode in the buried layer 208, where the interface of the right-most well 205 and the buried layer 208 provides a p-n junction of the diode D. As schematically shown in FIG. 2B, the anode of the diode D is coupled to a drain of the first transistor T1, the cathode of the diode D is coupled to a drain of the second transistor T2, and the resistor R is coupled in parallel with the diode D between the transistor drains.

The integrated resistor R and diode D provides a compact resistor to provide linear region current matching for the transistors T1 and T2 during a linear mode operation and the resistor self-clamps (e.g., the diode D limits the maximum voltage developed across the resistor R to the forward bias turn-on voltage of the diode D, such as approximately 0.6 to 0.7 volts) during a saturation mode operation—e.g., when the transistor T1 or T2 operates in a saturation mode. This advantageously achieves on-state drain-source resistance (Rdson) matching in the linear region between the transistor T1 and the transistor T2 (in conjunction with the resistor R) while limiting the power dissipation during the saturation mode operation of the pull-up or pull-down transistor T1 or T2 (e.g., forward biasing of the diode D limits the V*I power dissipation across the resistor R). The diode D is added as part of the resistor structure, with the HI node tied to the anode—e.g., the positive voltage across the resistor R providing a forward bias condition for the diode D. The third well 209 (in conjunction with the doped region 212) connects to the buried layer 208 to collect the diode current on one side of the resistor R. The p-n junction diode is forward biased during operation to clamp the resistor (when the positive voltage across the diode is greater than a threshold voltage, e.g., the diode turn-on voltage) and to limit the resistor voltage during a saturation mode operation of the transistors T1 or T2 with the resistor R and the diode D that are connected in parallel.

FIG. 2A illustrates a graph 240 including an I-V curve 242 that shows I-V characteristics of an example implementation of the resistor R and the integrated p-n junction diode D of FIG. 2. The graph 240 shows the current (IR) flowing between the HI node and the LO node and the voltage (VR) across the HI node and the LO node in operation. The resistor R conducts greater current than the diode D when the voltage VR is less than a threshold value (e.g., a forward-bias diode turn on voltage of the diode D), for example, in a first approximately linear region 244 of the I-V curve 242. In a second region 246 of the I-V curve 242 when the voltage VR is equal to or greater than the threshold value, the diode D turns on and conducts greater current than the resistor R to limit power dissipation in the circuit—e.g., limiting power dissipation by the resistor R by providing a current shunt path bypassing the resistor R. The example electronic device 200 integrates the p-n junction diode D as part of a well resistor R, and at low voltage and current, conduction in the well resistor R dominates, resulting in a linear I-V characteristic in the first region 244 in FIG. 2A. At high voltage and current, conduction in the p-n junction diode D dominates, resulting in a very rapid (e.g., exponential) increase in current in the second region 246 in FIG. 2A, effectively clamping the voltage VR across the resistor R. In various implementations, the resistor R (e.g., the drift region 113) can be n-type or p-type. In the case of an n-type resistor, a p-type buried layer or p-type dopant can be used to form the p-n junction of the diode D. In such a case, a p-well (or a p-type doped region) may be added at the end of the resistor R.

Figure 3:
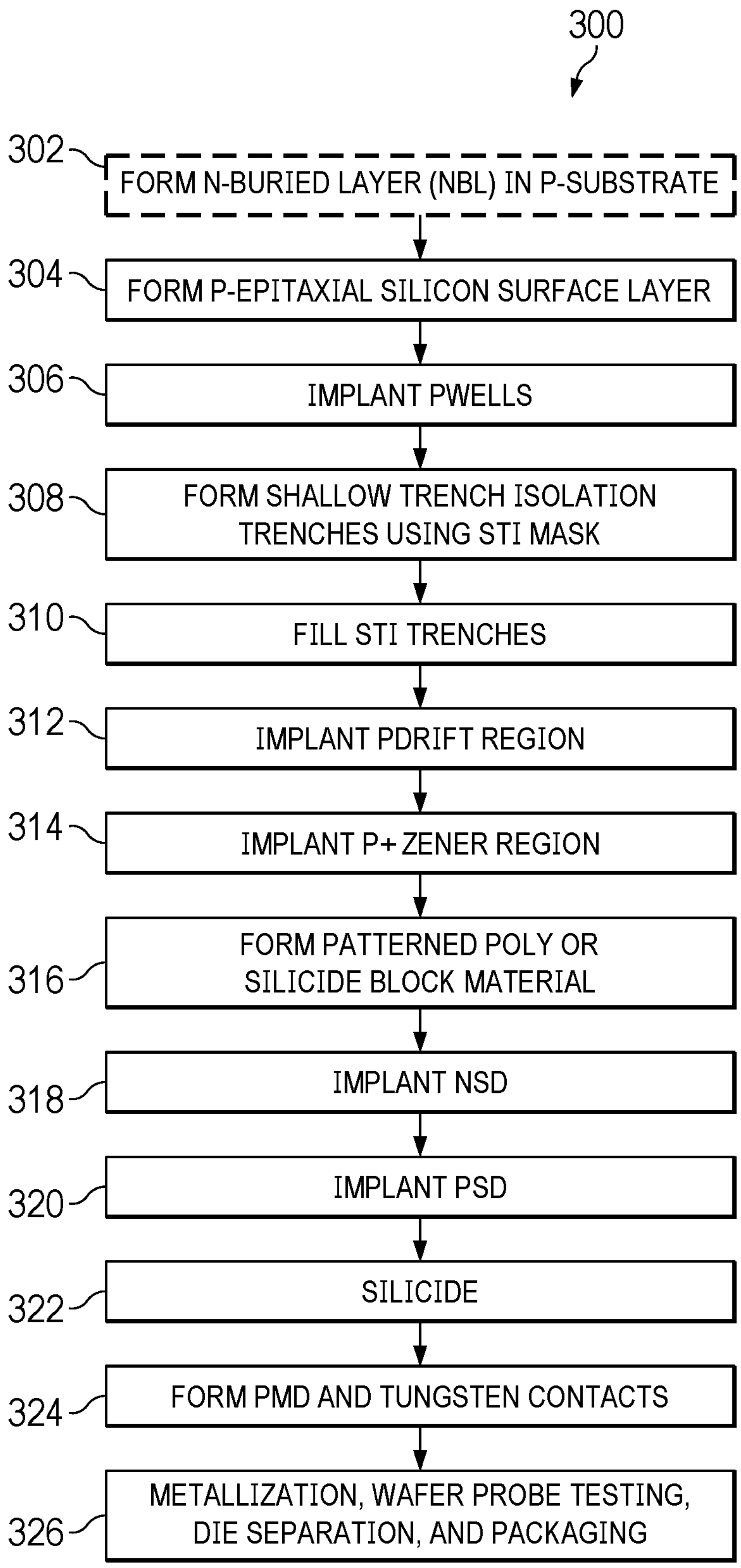
FIG. 3 is a flow diagram of a method for making an electronic device with a resistor and an integrated diode.

FIG. 3 shows a method 300 for making an electronic device and for making a resistor R and an integrated diode Z. D in an electronic device, and FIGS. 4-11 show the electronic device 100 of FIG. 1 undergoing fabrication processing according to an example implementation of the method 300. The illustrated ordering is only one possible example, and other implementations can include different ordering of the described acts or events and may include concurrent or parallel performance of one or more acts or events. At 302 in FIG. 3, a buried layer is optionally formed in a semiconductor structure, such as the n-type buried layer 208 in the example of FIG. 2 above. At 304, the method 300 includes forming an epitaxial semiconductor layer (e.g., the semiconductor layer 106 in FIGS. 1 and 1B above).

Figure 4:
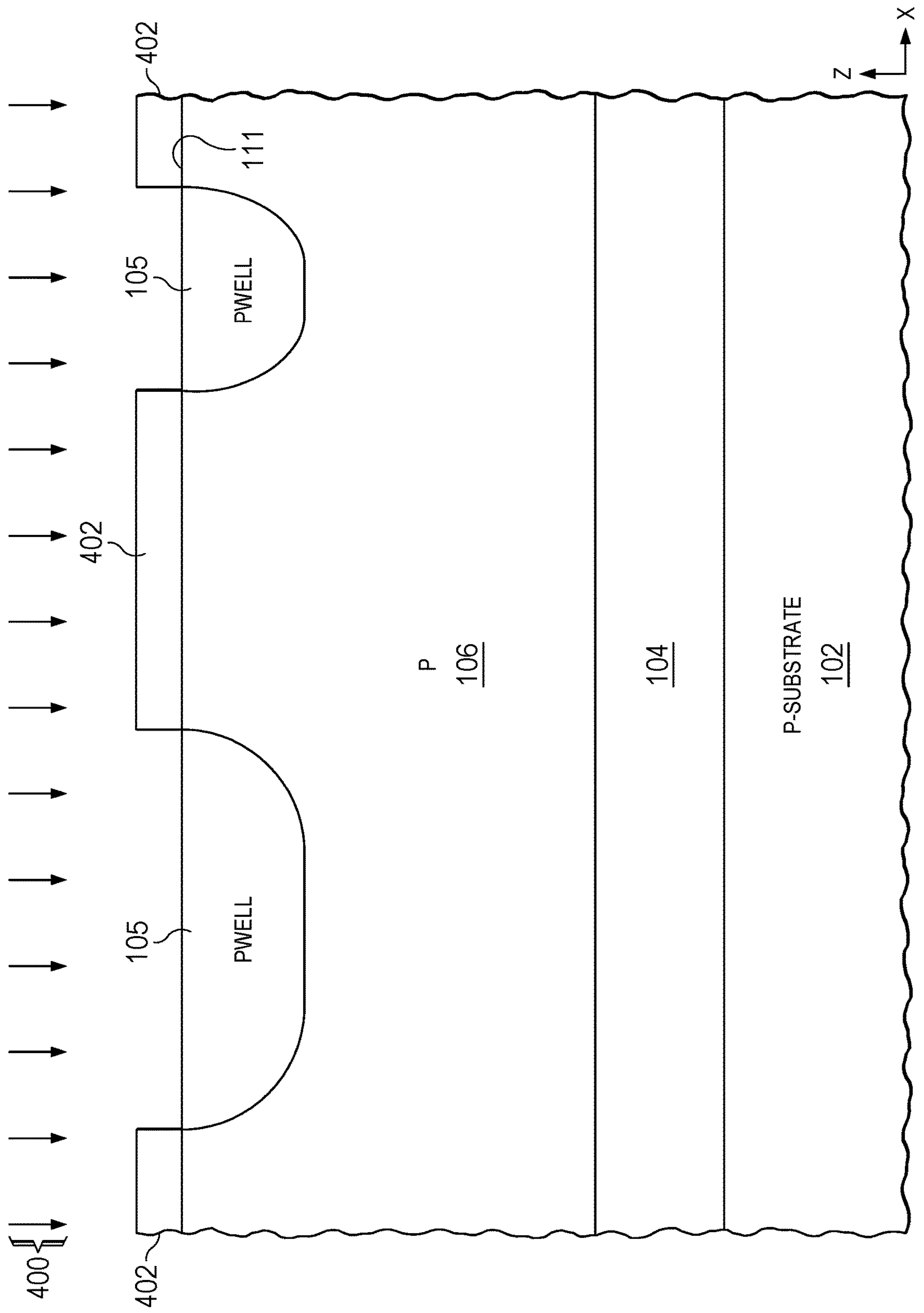
FIGS. 4-11 are partial sectional side elevation views of the electronic device of FIG. 1 at various stages of fabrication according to the method of FIG. 3.

At 306, the method 300 in one example includes forming the wells 105. FIG. 4 shows one example, in which an implantation process 400 is performed using a patterned implant mask 402 to form the first and second wells 105 including majority carrier dopants of the first conductivity type in the semiconductor layer 106, where the first and second wells 105 extend to respective laterally opposite sides of a prospective drift region. Although the example method illustrates an implantation process to introduce dopants into the selected regions of the semiconductor layer 106, the present disclosure is not limited thereto. For example, other means to introduce dopants can be utilized to dope the selected regions—e.g., one or more thermal process steps to expose the selected regions to an ambient including dopants such that dopants can migrate into the selected regions, forming a layer containing dopants on the selected regions and subsequently providing thermal energy for the dopants to diffuse into the selected regions.

Figure 5:
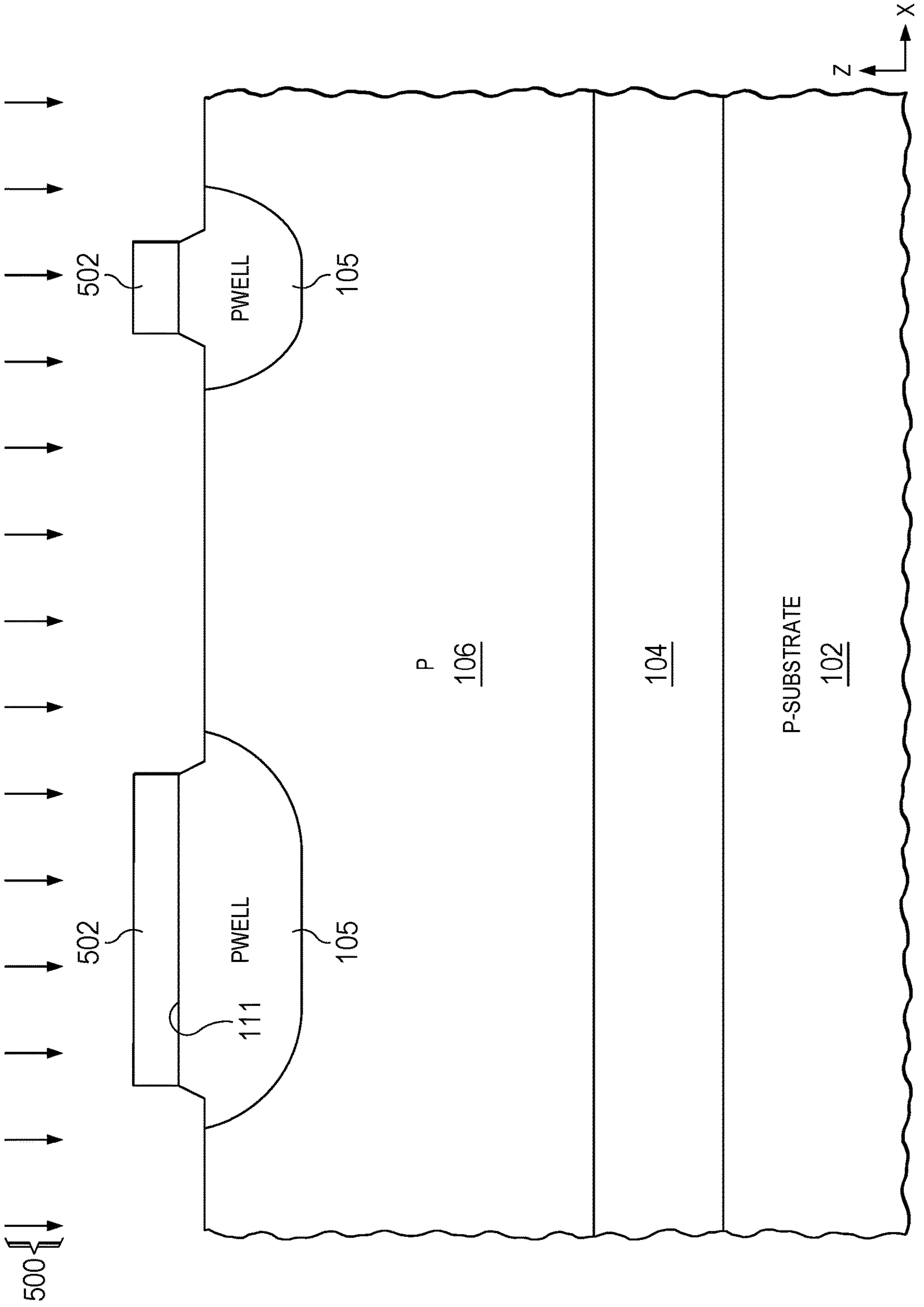

The method 300 continues at 308 in FIG. 3 with forming isolation structures, such as STI, LOCOS, etc. FIG. 5 shows one example, in which an STI trench etch process 500 is performed using a patterned etch mask 502 to form STI trenches 504 that extend into a portion of the top side 111 of the semiconductor layer 106.

Figure 6:
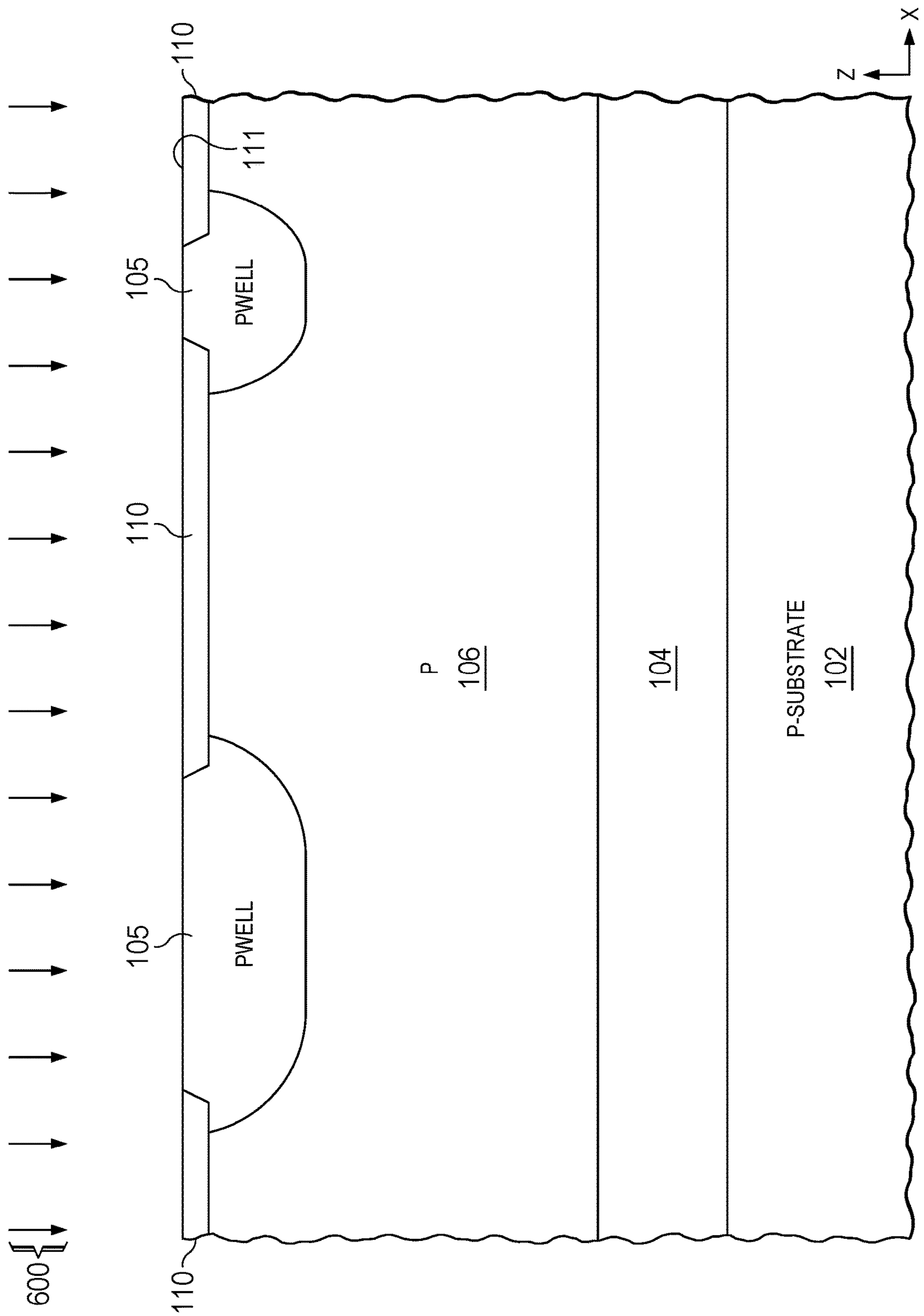

At 310, the STI trenches 404 are filled with $SiO_2$ or other suitable material to form the STI isolation structures. FIG. 6 shows an example, in which deposition and planarization (e.g., chemical mechanical polishing (CMP)) processing 600 is performed to form the STI structures 110 in the previously etched trenches.

Figure 7:
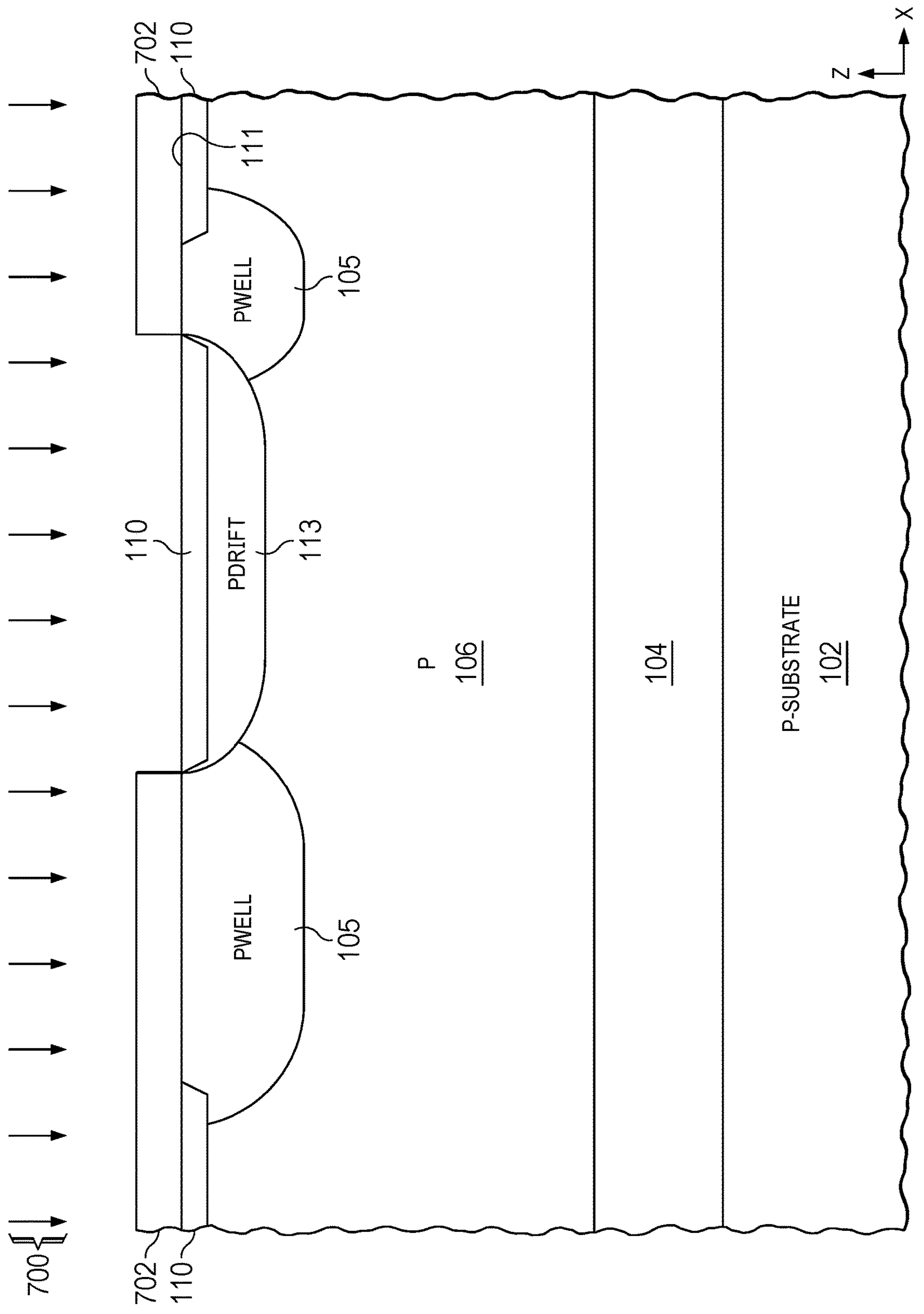

At 312 in FIG. 3, the method 300 continues with forming a drift region 113 including majority dopants of the first conductivity type (e.g., p-type) in the semiconductor layer 106. FIG. 7 shows one example, in which an implantation process 700 is performed using a patterned implant mask 702 to form the drift region 113 having implanted majority dopants of the first conductivity type in the semiconductor layer 106.

Figure 8:
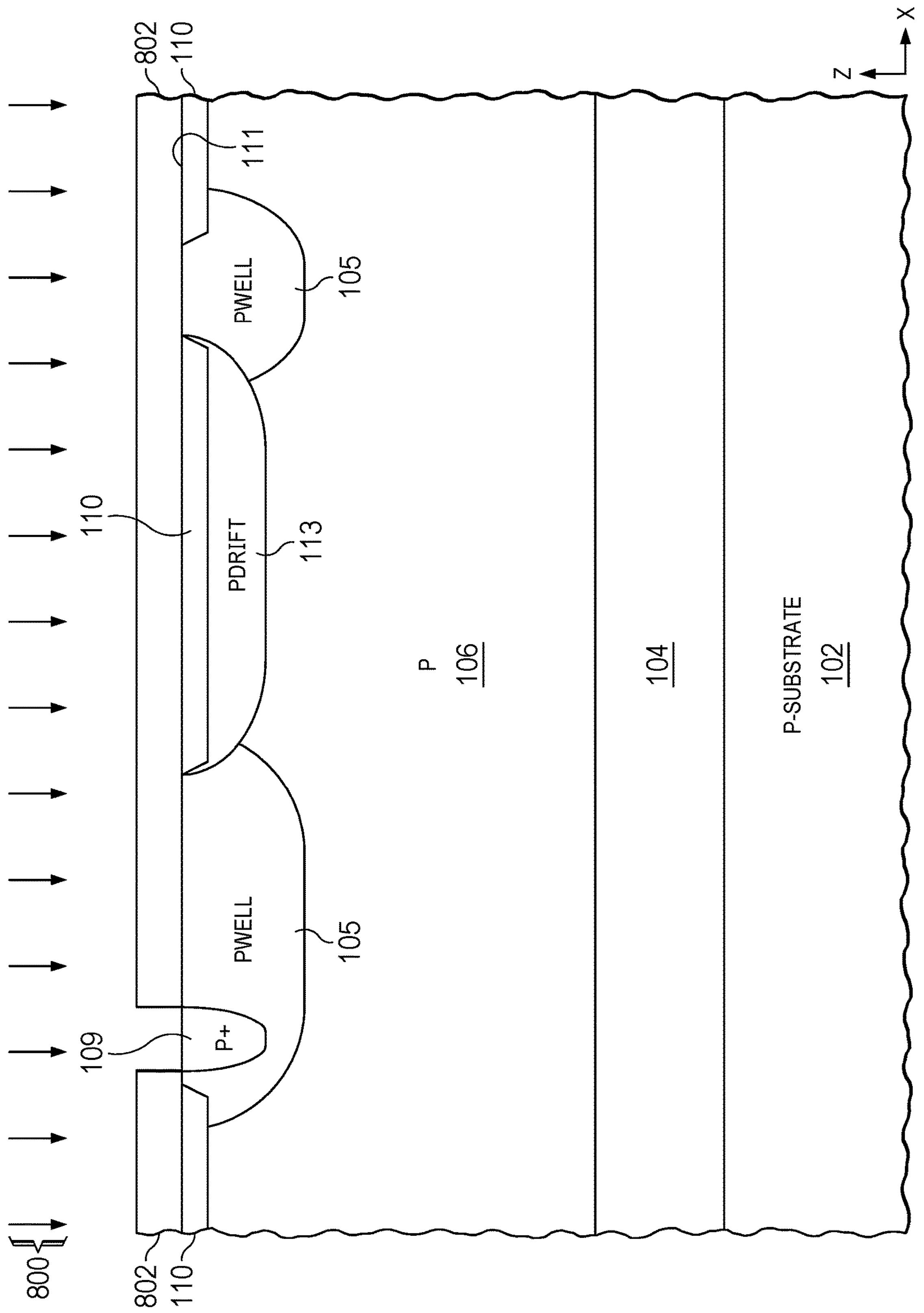
Figure 11:
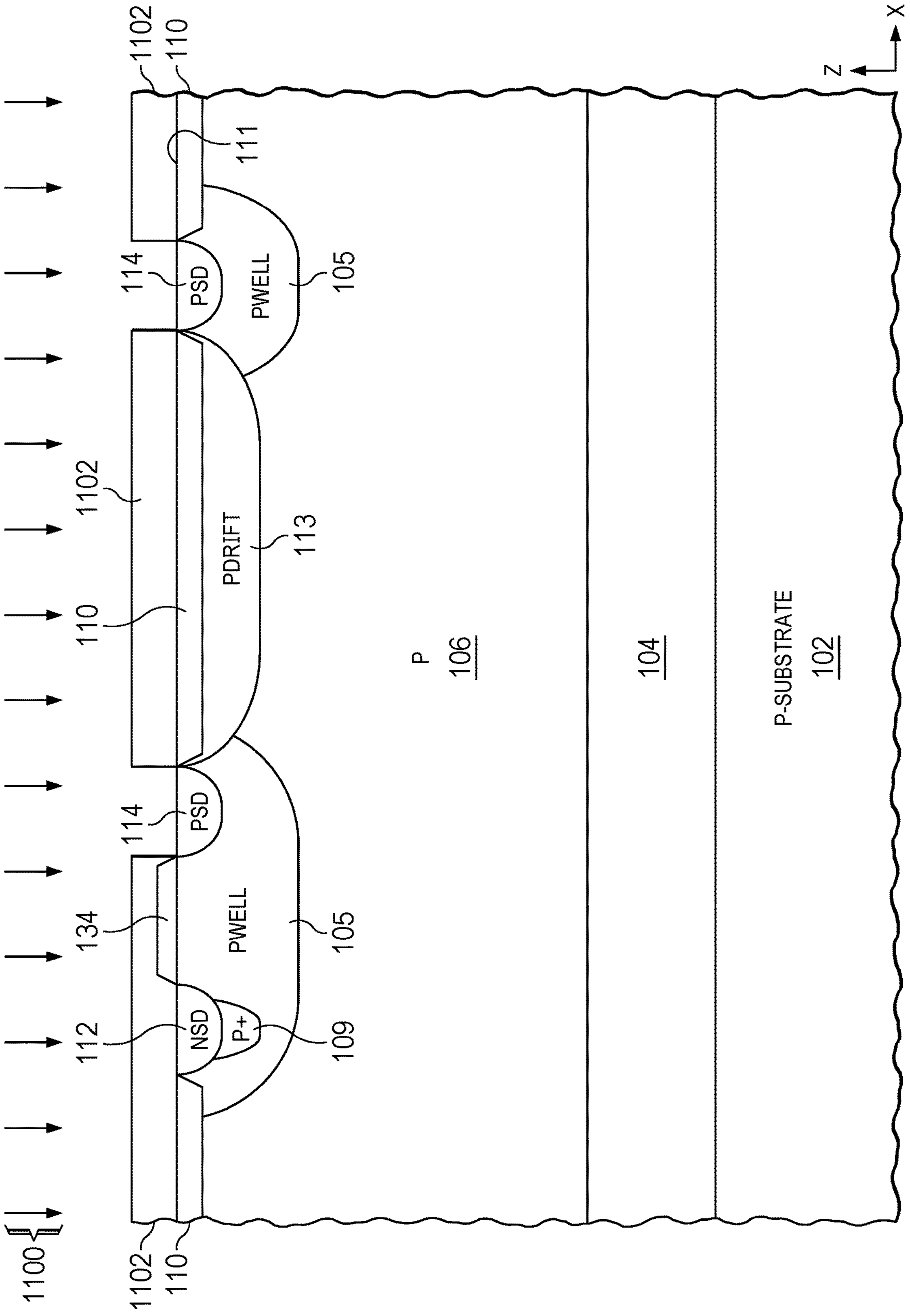

The method 300 continues at 314 in FIG. 3 with forming a third region 109, for example, with majority dopants of the first conductivity type to set a Zener voltage of the diode Z. FIG. 8 shows one example, in which an implantation process 800 is performed using a patterned implant mask 802 to form the implanted region 109 with majority carrier dopants of the first type in the second well 105 (and spaced apart from the prospective location of the second region 114 within the second well 105 as depicted in FIG. 11). In one example, the third region 109 is implanted at 314 to have a higher dopant concentration of majority carrier dopants of the first type than the second well 105.

Figure 9:
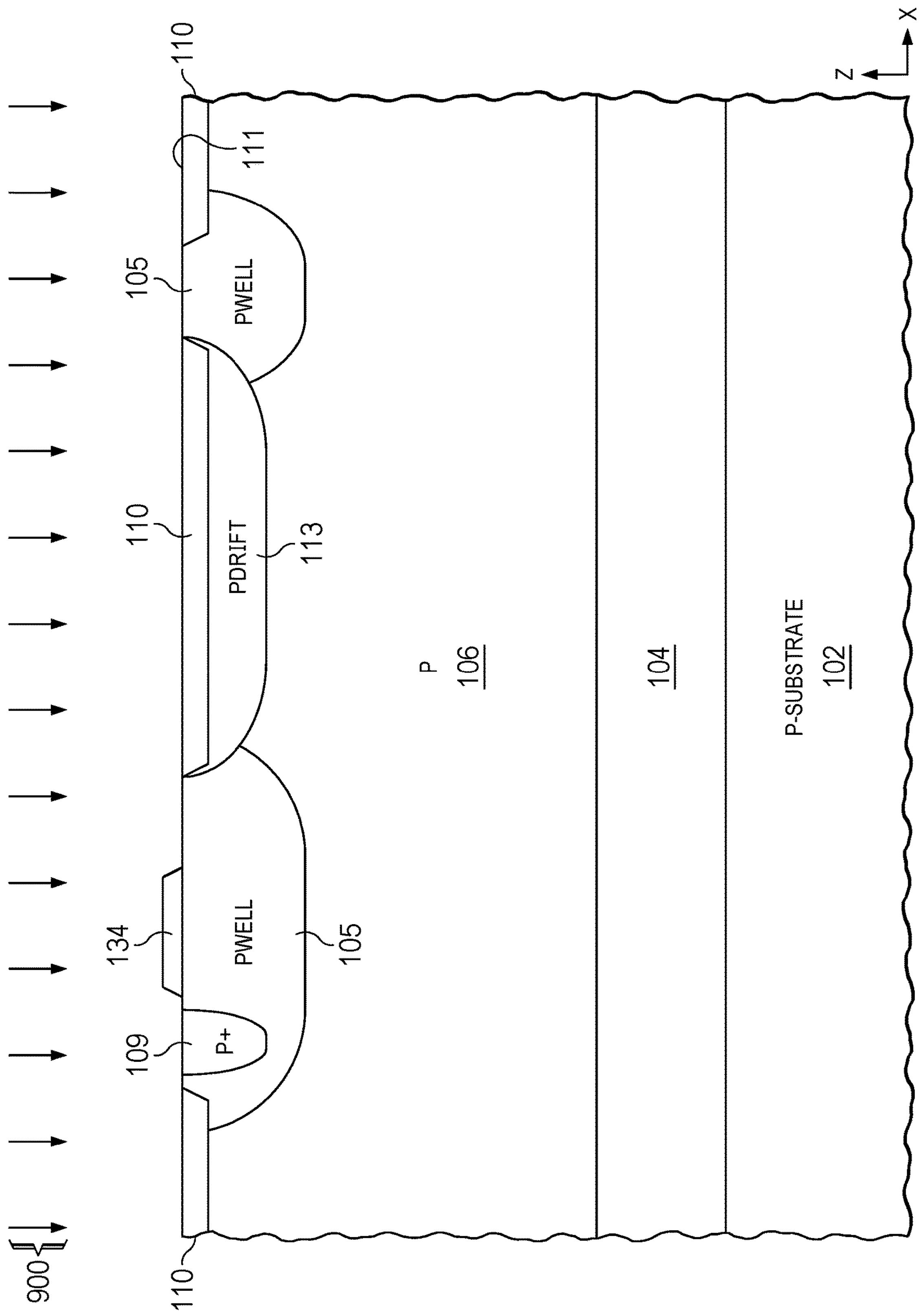

At 316, the method 300 includes forming patterned polysilicon and/or silicide block material. FIG. 9 shows one example, in which polysilicon or silicide block deposition and patterning processing 900 is performed that forms the silicide blocking layer 134 (SiBLK) or polysilicon that extends on a portion of the well 105 between the prospective locations of the regions 112 and 114. In another implementation, the silicide blocking layer 134 can be formed after the implantations at 318 and 320 and prior to silicidation at 322 in FIG. 3. In another implementation, the processing at 316 includes forming (e.g., depositing and patterning) polysilicon instead of silicide blocking material, followed by the implantations at 318 and 320.

Figure 10:
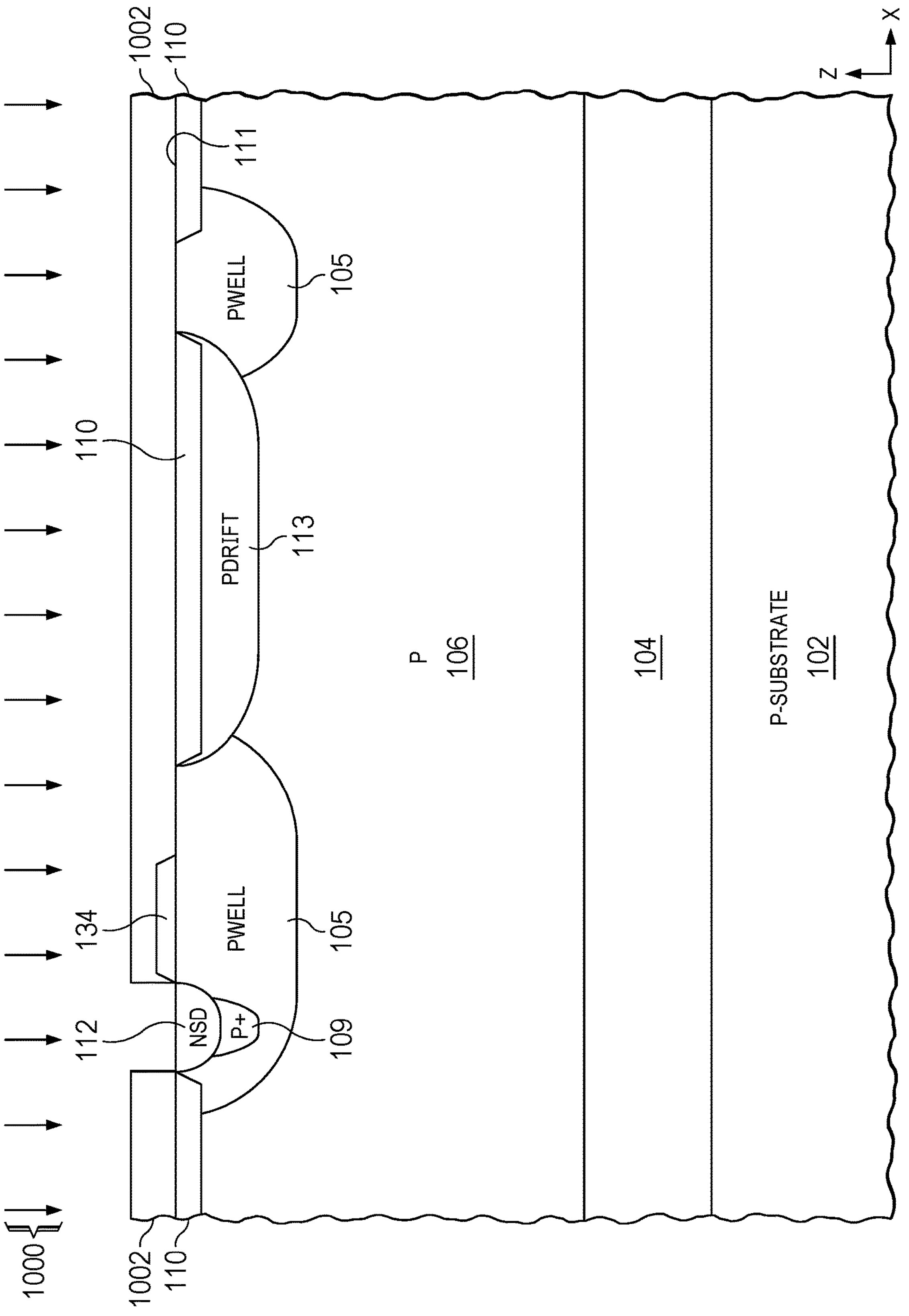

The method 300 continues at 318 in FIG. 3 with forming the fourth region 112. FIG. 10 shows one example, in which an implantation process 1000 is performed using a patterned implant mask 1002 to form the fourth implanted region 112 in the second well 105 and over (e.g., above) a portion of the implanted third region 109. The fourth implanted region 112 includes majority dopants of the second conductivity type such that an interface between the third and fourth regions 109 and 112 forms the p-n junction of the diode Z. A portion of the implanted region 112 may be counter doped with dopants remaining from the initial formation of the implanted third region 109 (e.g., at 314 in FIG. 3) and includes majority carrier dopants of the second conductivity type after the implantation at 318. The implantation process 1000 in one example concurrently forms n-type source/drain regions of the second transistor T2 of FIG. 1B above, although not a requirement of all possible implementations.

At 320 in FIG. 3, the method in one example includes further implanting to form the first and second regions 114. FIG. 11 shows one example, in which an implantation process 1100 is performed using a patterned implant mask 1002 to form the implanted regions 114 in the wells 105. The first and second regions 114 includes majority dopants of the first conductivity type. The implantation process 1100 in one example concurrently forms p-type source/drain regions 112 of the first transistor T1 of FIG. 1B above, although not a requirement of all possible implementations. The method 300 in one example continues at 322 with silicidation to form the silicide contacts (e.g., 131 in FIGS. 1 and 1B above), pre-metal dielectric (PMD) and contact (e.g., tungsten) formation at 324 (e.g., PMD 130 and contacts 132 in FIG. 1B above). The method 300 further includes metallization processing, wafer probe testing, die separation and packaging at 326.

Modifications are possible in the described examples, and other implementations are possible, within the scope of the claims.

What is claimed is:

1. An electronic device, comprising:

a semiconductor layer, a resistor in the semiconductor layer; and a diode in the semiconductor layer, wherein at least a portion of the resistor includes or forms a p-n junction of the diode, and wherein the resistor and the diode are connected in parallel.

2. The electronic device of claim 1, wherein:

the resistor conducts greater current than the diode when a voltage across the resistor is less than a threshold value; and the diode conducts greater current than the resistor when the voltage across the resistor is equal to or greater than the threshold value.

3. The electronic device of claim 1, wherein:

the resistor includes a first terminal extended in a first well in the semiconductor layer, the first well including majority dopants of a first conductivity type; and the p-n junction of the diode is located in the first well.

4. The electronic device of claim 3, wherein:

the diode includes a first region and a second region in the first well, an interface between the first and second regions forming the p-n junction, wherein the second region extends from a surface of the semiconductor layer and abuts the first region disposed below the second region;

the first region includes majority dopants of the first conductivity type; and the second region includes majority dopants of a second conductivity type opposite the first conductivity type.

5. The electronic device of claim 4, wherein the first terminal of the resistor includes a third region in the first well, the third region being spaced apart from the first and second regions and including majority dopants of the first conductivity type.

6. The electronic device of claim 5, wherein the resistor further includes:

a second terminal extended in a second well in the semiconductor layer and spaced apart from the first terminal, the second well having majority dopants of the first conductivity type; and a doped region that extends between the first and second terminals, the doped region having majority dopants of the first conductivity type.

7. The electronic device of claim 6, wherein the first conductivity type is p-type and the second conductivity type is n-type.

8. The electronic device of claim 6, further comprising a p-channel metal-oxide-semiconductor field effect transistor (MOSFET) and an n-channel transistor MOSFET, wherein;

the second region of the diode is coupled to a drain of the p-channel MOSFET and to the second terminal of the resistor; and the first region of the diode is coupled to a drain of the n-channel MOSFET and to the first terminal of the resistor.

9. The electronic device of claim 1, wherein:

the resistor includes a first terminal extended in a first well in the semiconductor layer, the first well including majority dopants of a first conductivity type; and the diode includes a buried layer disposed below the first well and abutting the first well, an interface between the buried layer and the first well forming the p-n junction, wherein the buried layer includes majority dopants of a second conductivity type opposite the first conductivity type.

10. The electronic device of claim 9, wherein the resistor further comprises:

a second terminal extended in a second well in the semiconductor layer and spaced apart from the first terminal, the second well having majority dopants of the first conductivity type; and a doped region that extends between the first and second terminals, the doped region having majority dopants of the first conductivity type.

11. The electronic device of claim 10, wherein the diode further comprises:

a third well extended between a surface of the semiconductor layer and the buried layer, wherein the third well including majority dopants of the second conductivity type.

12. The electronic device of claim 11, wherein the third well is spaced apart from the first well and laterally abuts the second well.

13. The electronic device of claim 11, wherein the first conductivity type is p-type and the second conductivity type is n-type.

14. The electronic device of claim 11, further comprising a p-channel metal-oxide-semiconductor field effect transistor (MOSFET) and an n-channel MOSFET, wherein:

the third well of the diode is coupled to a drain of the n-channel MOSFET and to the second terminal of the resistor; and the first terminal of the diode is coupled to a drain of the p-channel MOSFET.

15. A circuit, comprising:

a p-channel metal-oxide-semiconductor field effect transistor (MOSFET);

an n-channel MOSFET;

a resistor having first and second terminals, the first terminal coupled to a drain of the p-channel MOSFET, and the second terminal coupled to a drain of the n-channel MOSFET; and a diode integrated with the resistor in a semiconductor layer and coupled in parallel, wherein at least a portion of the resistor includes or forms a p-n junction of the diode.

16. The circuit of claim 15, wherein:

the resistor conducts greater current than the diode when a voltage across the resistor is less than a threshold value; and the diode conducts greater current than the resistor when the voltage across the resistor is equal to or greater than the threshold value.

17. The circuit of claim 15, wherein:

the resistor conducts greater current than the diode when the p-channel and n-channel MOSFETs are in a linear operation mode; and the diode conducts greater current than the resistor when the p-channel or n-channel MOSFETs are in a saturation operation mode.

18. The circuit of claim 15, wherein:

the first terminal is a cathode of the diode; and the second terminal is an anode of the diode, wherein the diode conducts greater current than the resistor when a voltage across the resistor is equal to or greater than a threshold value, the voltage reverse biasing the diode.

19. The circuit of claim 15, wherein:

the first terminal is an anode of the diode; and the second terminal is a cathode of the diode, wherein the diode conducts greater current than the resistor when a voltage across the resistor is equal to or greater than a threshold value, the voltage forward biasing the diode.

20. A method of fabricating an electronic device, the method comprising:

forming a resistor in a semiconductor layer, including:

forming a doped region including majority dopants of a first conductivity type in the semiconductor layer;

forming first and second wells including majority carrier dopants of the first conductivity type in the semiconductor layer, the first and second wells extending to respective laterally opposite sides of the doped region; and forming first and second regions including majority dopants of the first conductivity type, the first region extending in the first well, and the second region extending in the second well; and forming a diode in the semiconductor layer, wherein at least a portion of the resistor includes or forms a p-n junction of the diode.

21. The method of claim 20, wherein forming the diode includes:

forming a third region including majority dopants of the first conductivity type in the second well and spaced apart from the second region, the third region having a higher dopant concentration than the second well.

22. The method of claim 21, wherein forming the diode further includes:

forming a fourth region including majority dopants of a second conductivity type over the third region, an interface between the third and fourth regions forming the p-n junction of the diode.

23. The method of claim 20, wherein forming the diode includes:

forming a buried layer spaced apart from a surface of the semiconductor layer, the buried layer including majority dopants of a second conductivity type, and a portion of the buried layer contacting a portion of the first well to form a p-n junction of the diode.

24. The method of claim 23, wherein forming the diode further includes:

forming a third well extended between the surface of the semiconductor layer and the buried layer, wherein the third well including majority dopants of the second conductivity type.

* * * * *